(12) United States Patent
Pardhan et al.

(10) Patent No.: US 11,569,629 B2
(45) Date of Patent: Jan. 31, 2023

(54) THERMAL ROTARY LINK

(71) Applicant: Waymo LLC, Mountain View, CA (US)

(72) Inventors: Rahim Pardhan, San Francisco, CA (US); William McCann, San Francisco, CA (US); Drew Ulrich, San Francisco, CA (US); Pierre-yves Droz, Los Altos, CA (US)

(73) Assignee: Waymo LLC, Mountain View, CA (US)

( * ) Notice: Subject to any disclaimer, the term of this patent is extended or adjusted under 35 U.S.C. 154(b) by 174 days.

(21) Appl. No.: 16/943,862

(22) Filed: Jul. 30, 2020

(65) Prior Publication Data

US 2020/0358242 A1 Nov. 12, 2020

Related U.S. Application Data

(63) Continuation of application No. 15/295,573, filed on Oct. 17, 2016, now Pat. No. 10,749,308.

(51) Int. Cl.
*H01S 3/04* (2006.01)
*H01S 3/067* (2006.01)
(Continued)

(52) U.S. Cl.
CPC .......... *H01S 3/0405* (2013.01); *G01S 7/4813* (2013.01); *G01S 7/4817* (2013.01);
(Continued)

(58) Field of Classification Search
CPC .... G01S 17/931; G01S 7/4813; G01S 7/4817; H02K 9/227; H01S 3/0405; H01S 3/067
(Continued)

(56) References Cited

U.S. PATENT DOCUMENTS 3,253,300 A 5/1966 Gove et al.
3,844,341 A 10/1974 Bimshas, Jr. et al.
(Continued)

FOREIGN PATENT DOCUMENTS

WO 2015027004 A1 2/2015
WO WO-2015027004 A1 * 2/2015 .............. F28F 13/12

OTHER PUBLICATIONS

International Searching Authority, International Search Report and the Written Opinion of the International Searching Authority dated Jul. 24, 2018, issued in connection with International Application No. PCT/US2017/056526, filed Oct. 13, 2017, 13 pages.
(Continued)

*Primary Examiner* — Tho V Duong
*Assistant Examiner* — Raheena R Malik
(74) *Attorney, Agent, or Firm* — McDonnell Boehnen Hulbert & Berghoff LLP

(57) ABSTRACT

An example apparatus may include a first plate having a first side. A first plurality of fins may be integral with the first side of the first plate and protruding perpendicularly therefrom. The first plurality of fins may be arranged in first concentric circles separated radially by a first distance. The apparatus may also include a second plate having a first side. The second plate may be rotatably coupled to the first plate. A second plurality of fins may be integral with the first side of the second plate and protruding perpendicularly therefrom. The second plurality of fins may be arranged in second concentric circles separated radially by the first distance. Each fin of the second plurality of fins may interpose between adjacent fins of the first plurality of fins to transfer heat between the second plate and the first plate.

20 Claims, 16 Drawing Sheets

(51) Int. Cl.
  *G01S 7/481* (2006.01)
  *G01S 17/931* (2020.01)
  *H02K 9/22* (2006.01)
(52) U.S. Cl.
  CPC ............ *G01S 17/931* (2020.01); *H01S 3/067* (2013.01); *H02K 9/227* (2021.01)
(58) Field of Classification Search
  USPC .......................................................... 165/86
  See application file for complete search history.

(56) References Cited

U.S. PATENT DOCUMENTS

| | | | |
|---|---|---|---|
| 6,021,844 | A | 2/2000 | Batchelder |
| 6,100,618 | A | 8/2000 | Schoeb et al. |
| 6,138,748 | A | 10/2000 | Hamburgen et al. |
| 6,625,990 | B2 | 9/2003 | Bell |
| 7,249,625 | B2 * | 7/2007 | Duan ................. G06F 1/20 257/E23.098 |
| 7,667,969 | B2 | 2/2010 | Khanna et al. |
| 9,261,100 | B2 | 2/2016 | Koplow |
| 9,383,753 | B1 | 7/2016 | Templeton et al. |
| 10,749,308 | B2 | 8/2020 | Pardhan et al. |
| 2001/0050164 | A1 | 12/2001 | Wagner et al. |
| 2006/0021735 | A1 | 2/2006 | Lopatinsky et al. |
| 2006/0060328 | A1 | 3/2006 | Ewes et al. |
| 2007/0103869 | A1 | 5/2007 | Liu et al. |
| 2008/0158819 | A1 | 7/2008 | Khanna et al. |
| 2008/0159853 | A1 | 7/2008 | Khanna et al. |
| 2009/0263232 | A1 | 10/2009 | Jarrah |
| 2011/0216304 | A1 | 9/2011 | Hall |
| 2012/0223640 | A1 | 9/2012 | Koplow |
| 2012/0305224 | A1 | 12/2012 | Kim et al. |
| 2014/0293263 | A1 | 10/2014 | Justice et al. |
| 2016/0041452 | A1 | 2/2016 | Nomura et al. |
| 2016/0178289 | A1 * | 6/2016 | Gonzalez .............. H01L 23/467 165/80.3 |

OTHER PUBLICATIONS

International Searching Authority, International Preliminary Report on Patentability, dated Apr. 23, 2019, issued in connection with International Application No. PCT/US2017/056526, filed Oct. 13, 2017, 11 pages.

European Patent Office, Extended European Search Report dated Feb. 27, 2020, issued in connection with European Patent Application No. 17889766.6, 8 pages.

\* cited by examiner

THERMAL ROTARY LINK

CROSS-REFERENCE TO RELATED APPLICATIONS

This application is a continuation of U.S. patent application Ser. No. 15/295,573, filed Oct. 17, 2016, which is incorporated herein by reference.

BACKGROUND

Heatsinks are passive heat exchangers that transfer and dissipate heat generated by an electronic or mechanical device away from the device to maintain the device at an appropriate operating temperature. The generated heat may be dissipated to a fluid medium such as ambient air or liquid coolant. Heatsinks are commonly used with high-power semiconductor devices and optoelectronics such as lasers and light emitting diodes (LEDs), where the heat dissipation characteristics of the components itself is insufficient to maintain the component at a safe and stable temperature during operation. To increase the heat dissipated by the heatsink, the surface area of the heatsink in contact with the surrounding cooling medium may be increased or maximized. Additionally, heat dissipation may be improved by manufacturing the heat sink from thermally conductive materials such as aluminum. Further, fluid may be forced over the heatsink by way of a fan or propeller to maintain a large temperature difference between the heatsink and the surrounding fluid.

SUMMARY

In an example embodiment, a thermal rotary link is configured to transfer heat between two or more devices, systems, or objects in rotational motion with respect to one another. The thermal rotary link may include a rotor and a stator, each including a respective plate and a plurality of fins protruding perpendicularly from the respective plate. The rotor and the stator may be rotatably connected together by a rotational joint. The plurality of fins may be arranged in concentric circles so that fins of the rotor may interpose with fins of the stator. The plurality of fins may be designed to increase or maximize a surface area exposed between fins of the rotor and fins of the stator. When the fins of the rotor and fins of the stator are interposed with one another, heat may be transferred from the fins of the rotor to fins of the stator by way of an air gap separating adjacent fins. The rotor and stator may be used to transfer heat from a heat source such as a rotating LIDAR device to a cooling device. In some embodiments, the rotor and stator may be disposed within a sealed chamber filled with a thermally conductive fluid to improve heat transfer between fins of the rotor and fins of the stator.

In one embodiment, an apparatus is provided that includes a first plate having a first side and a first plurality of fins integral with the first side of the first plate and protruding perpendicularly therefrom. The first plurality of fins may be arranged in first concentric circles separated radially by a first distance. The apparatus may also include a second plate having a first side. The second plate may be rotatably coupled to the first plate. The apparatus may additionally include a second plurality of fins integral with the first side of the second plate and protruding perpendicularly therefrom. The second plurality of fins may be arranged in second concentric circles separated radially by the first distance. Each fin of the second plurality of fins may interpose between adjacent fins of the first plurality of fins to transfer heat between the second plate and the first plate.

In another embodiment, a system is provided that includes a thermal rotary link. The thermal rotary link may include a first plate having a first side and a second side opposite the first side. The thermal rotary link may additionally include a first plurality of fins integral with the first side of the first plate and protruding perpendicularly therefrom. The first plurality of fins may be arranged in first concentric circles separated radially by a first distance. The thermal rotary link may also include a second plate having a first side and a second side opposite to the first side. The second plate may be rotatably coupled to the first plate. The thermal rotary link may further include a second plurality of fins integral with the first side of the second plate and protruding perpendicularly therefrom. The second plurality of fins may be arranged in second concentric circles separated radially by the first distance. Each fin of the second plurality of fins may interpose between adjacent fins of the first plurality of fins to transfer heat between the second plate and the first plate. The system may also include a rotating heat source thermally connected to the second side of the second plate. The system may further include a cooling device thermally connected to the second side of the first plate. The cooling device may be configured to absorb heat transferred from the rotating heat source by way of the thermal rotary link.

In a further embodiment, a method is provided that includes conducting heat from a rotating heat source to a first plate. The first plate includes a first plurality of fins integral with a first side of the first plate and protruding perpendicularly therefrom. The first plurality of fins is arranged in first concentric circles separated radially by a first distance. The rotating heat source is fixedly connected to a second side of the first plate and is in thermal contact therewith. The method also includes rotating the first plate with respect to a second plate. The method additionally includes conducting heat from the first plate to the second plate by way of the first plurality of fins interposing with and rotating with respect to a second plurality of fins. The second plurality of fins is integral with a first side of the second plate and protruding perpendicularly therefrom. The second plurality of fins is arranged in second concentric circles separated radially by the first distance. Each fin of the second plurality of fins interposes between adjacent fins of the first plurality of fins. The method further includes conducting heat from the second plate to a cooling device in thermal contact with a second side of the second plate.

In a yet further embodiment, a system is provided that includes a stator means having a first side and a first plurality of fin means integral with the first side of the stator means and protruding perpendicularly therefrom. The first plurality of fin means may be arranged in first concentric circles separated radially by a first distance. The system may also include a rotor means having a first side. The rotor means may be rotatably coupled to the stator means. The system may additionally include a second plurality of fin mean integral with the first side of the rotor means and protruding perpendicularly therefrom. The second plurality of fin means may be arranged in second concentric circles separated radially by the first distance. Each fin means of the second plurality of fin means may interpose between adjacent fin means of the first plurality of fin means to transfer heat between the rotor means and the stator means.

The foregoing summary is illustrative only and is not intended to be in any way limiting. In addition to the illustrative aspects, embodiments, and features described above, further aspects, embodiments, and features will

DETAILED DESCRIPTION

Figure 1:
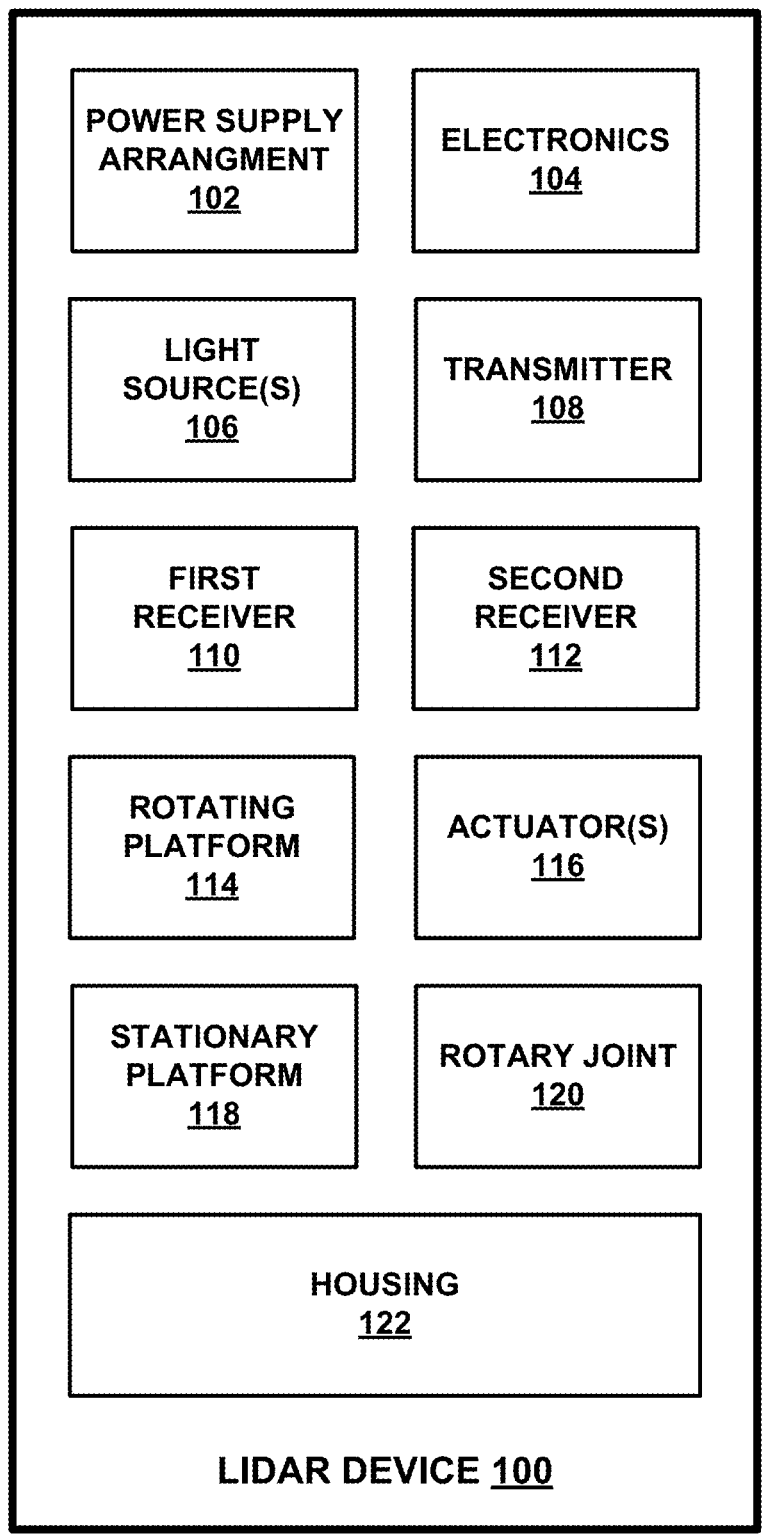
FIG. 1 illustrates a block diagram of an example LIDAR device, according to an example embodiment.

The following detailed description describes various features and operations of the disclosed devices, systems, and methods with reference to the accompanying figures. The illustrative device, system, and method embodiments described herein are not meant to be limiting. It should be understood that the words "exemplary," "example," and "illustrative," are used herein to mean "serving as an example, instance, or illustration." Any implementation, embodiment, or feature described herein as "exemplary," "example," or "illustrative," is not necessarily to be construed as preferred or advantageous over other implementations, embodiments, or features. Further, aspects of the present disclosure, as generally described herein and illustrated in the figures, can be arranged, substituted, combined, separated, and designed in a wide variety of different configurations.

In the following detailed description, reference is made to the accompanying figures, which form a part thereof. In the figures, similar symbols typically identify similar components, unless context dictates otherwise. Other embodiments may be utilized, and other changes may be made, without departing from the spirit or scope of the subject matter presented herein. Further, unless otherwise noted, figures are not drawn to scale and are used for illustrative purposes only. Moreover, the figures are representational only and not all components are shown. For example, additional structural or restraining components might not be shown.

I. Overview

Provided herein are example embodiments of a thermal rotary link for creating a thermal connection between two or more devices, systems, or objects that are configured to rotate with respect to one another. The thermal rotary link may include a rotor and a stator, each including a respective planar plate and a respective plurality of fins protruding perpendicularly from the planar plate. The rotor and the stator may be rotatably connected by a rotational joint disposed between the plates of the rotor and the stator. The rotor and stator may be connected axially to rotate about a common axis of rotation defined by the rotational joint. In some embodiments, the rotational joint may additionally serve as a conduit for wired or wireless power and data connections between the rotating heat source and a stationary surface to which the stator of the thermal rotary link is mounted. The rotor may be thermally and fixedly connected to a heat source and the stator may be thermally and fixedly connected to a cooling device.

The plurality of fins may be arranged in concentric circles such that that fins of the rotor may interpose with fins of the stator. Specifically, the finned side of the rotor may face the finned side of the stator and each fin of the rotor may fit between and/or next to corresponding fins of the stator, and vice versa. Notably, the innermost and outermost fins of all the fins on the rotor and the stator might only have one neighboring fin. Nonetheless, the fins can be viewed as interposing with at least one other corresponding fin protruding from the opposite plate (i.e., the opposite plate to a fin of the stator is the plate of the rotor, and vice versa). Each of the remaining fins may fit between two corresponding adjacent fins on the opposite plate.

The plurality of fins may be designed to increase or maximize a surface area exposed between fins of the rotor and fins of the stator. Heat may be transferred from the fins of the rotor to fins of the stator by way of an air gap separating adjacent fins when the fins of the rotor and fins of the stator are interposed with one another. The gap may be reduced or minimized to decrease the extent of air or other fluid through which heat has to flow to move between fins of the rotor and fins of the stator. Heat may be transferred between the fins via conduction. Rotation of the rotor with respect to the stator may, in some embodiments, additionally induce convective heat transfer from motion of the fluid (e.g., air) in the gaps between adjacent fins. The thermal rotary link may be used to transfer heat from a heat source such as a rotating LIDAR device to a cooling device.

In one example, the heat source may be a LIDAR device configured to rotate about an axis to scan the environment surrounding the LIDAR device. In order to acquire scans with a sufficient resolution or signal-to-noise ratio, the power with which the LIDAR device is operated might need to be above a threshold power level. However, operating the LIDAR device above the threshold power level may generate excess heat that the LIDAR device might not be able to dissipate at a rate sufficient to maintain the LIDAR device within a safe operating temperature range. The inability to dissipate heat at a sufficient rate may stem from, for example, a density with which the electrical and optical components of the LIDAR device are packaged inside the LIDAR device housing. The example thermal rotary links herein described may be used to transfer excess heat away from the LIDAR device to maintain the LIDAR device at stable operating temperatures even when the LIDAR device is operating above the threshold power level. At the same time, the thermal rotary link may provide for rotation of the LIDAR device with respect to the vehicle or structure to which the LIDAR device is mounted.

In alternative examples, the heat source may be a sensor such as, for example, a Radio Detection and Ranging (RADAR) device, a Sound Navigation and Ranging (SONAR) device, a camera (e.g., stereo camera, structured light device), or an inertial measurement unit (IMU). The sensor may be configured to rotate about an axis to scan the environment surrounding the sensor. The example thermal rotary links herein described may be used to transfer excess heat away from the sensor to maintain the sensor at stable operating temperatures may provide for rotation of the sensor with respect to a vehicle or structure to which the sensor is mounted.

In some embodiments, the concentric circles in which the fins of the rotor and the stator are arranged may be radially offset from one another to allow each fin of the plurality of fins of the rotor to interpose between corresponding adjacent fins of the plurality of fins of the stator, and vice versa. In particular, each of the fins of the rotor and the stator may have a uniform first thickness. Adjacent concentric circles on the rotor may be offset from one another by a distance greater than the first thickness to allow the corresponding fin of the stator to fit in between the fins within the adjacent concentric circles, and vice versa. Additionally, the concentric circles of the rotor may be radially offset from corresponding concentric circles of the stator by at least the first thickness to prevent the fins on the stator from colliding with the fins of the rotor (even though gaps between radially adjacent fins may be large enough to accommodate corresponding fins). In alternative embodiments, fin thickness may be non-uniform. Radial spacing between concentric circles may vary in proportion to the thickness of the respective fins configured to interpose therebetween.

In some examples, each of the concentric circles in which the plurality of fins is arranged may be defined by a single fin. That is, each fin of the rotor and the stator may extend continuously about the circumference of a respective concentric circle. In alternative examples, two or more fins may extend along portions of the circumference of each respective concentric circle. Angular offsets between fins within a concentric circle may be configured to generate and allow for convective fluid flow when the plurality of fins of the rotor is rotated with respect to the plurality of fins of the stator.

In further embodiments, the rotor and stator may be enclosed in a sealed chamber filled with a thermally conductive fluid. The sealed chamber may be filled with a gas or liquid that is more thermally conductive than atmospheric air to improve heat transfer between the rotor and the stator.

In yet further embodiments, a cylindrical space may be defined between the plate of the rotor, the plate of the stator, and the innermost fins of either the rotor or the stator. Disposed within the space may be a rotary transformer that provides wireless power to electronic devices on the rotor side and a stationary power source on the stator side. Thus, power may be transferred across the rotational joint between rotor and stator without using a slip ring. Similarly, data may be transferred wirelessly across the rotational connection by way of one or more wireless modules such as near-field radio frequency coupling units.

II. Example LIDAR Devices

Referring now to the Figures, FIG. 1 is a simplified block diagram of a LIDAR device 100, according to an example embodiment. As shown, the LIDAR device 100 includes a power supply arrangement 102, electronics 104, light source (s) 106, a transmitter 108, a first receiver 110, a second receiver 112, a rotating platform 114, actuator(s) 116, a stationary platform 118, a rotary link 120, and a housing 122. In other embodiments, the LIDAR device 100 may include more, fewer, or different components. Additionally, the components shown may be combined or divided in any number of ways.

Power supply arrangement 102 may be configured to supply power to various components of the LIDAR device 100. In particular, the power supply arrangement 102 may include or otherwise take the form of at least one power source disposed within the LIDAR device 100 and connected to various components of the LIDAR device 100 in any feasible manner, so as to supply power to those components. Additionally or alternatively, the power supply arrangement 102 may include or otherwise take the form of a power adapter or the like that is configured to receive power from one or more external power sources (e.g., from a power source arranged in a vehicle to which the LIDAR device 100 is coupled) and to supply that received power to various components of the LIDAR device 100 in any feasible manner. In either case, any type of power source may be used such as, for example, a battery.

Electronics 104 may include one or more electronic components and/or systems each arranged to help facilitate certain respective operations of the LIDAR device 100. In practice, these electronics 104 may be disposed within the LIDAR device 100 in any feasible manner. For instance, at least some of the electronics 104 may be disposed within a central cavity region of the rotary link 120. Nonetheless, the electronics 104 may include various types of electronic components and/or systems.

For example, the electronics 104 may include various wirings used for transfer of control signals from a controller to various components of the LIDAR device 100 and/or for transfer of data from various components of the LIDAR device 100 to the controller. Generally, the data that the controller receives may include sensor data based on detections of light by the receivers 110-112, among other possibilities. Moreover, the control signals sent by the controller may operate various components of the LIDAR device 100, such as by controlling emission of light by the transmitter 106, controlling detection of light by the receivers 110-112, and/or controlling the actuator(s) 116 to rotate the rotating platform 112, among other possibilities.

In some arrangements, the electronics 104 may also include the controller at issue. This controller may have one or more processors, data storage, and program instructions stored on the data storage and executable by the one or more processor to facilitate various operations. Additionally or alternatively, the controller may communicate with an external controller or the like (e.g., a computing system arranged in a vehicle to which the LIDAR device 100 is coupled) so as to help facilitate transfer of control signals and/or data between the external controller and the various components of the LIDAR device 100.

In other arrangements, however, the electronics 104 may not include the controller at issue. Rather, at least some of the above-mentioned wirings may be used for connectivity to an external controller. With this arrangement, the wirings may help facilitate transfer of control signals and/or data between the external controller and the various components of the LIDAR device 100. Other arrangements are possible as well.

Further, one or more light sources 106 can be configured to emit, respectively, a plurality of light beams and/or pulses having wavelengths within a wavelength range. The wavelength range could be, for example, in the ultraviolet, visible, and/or infrared portions of the electromagnetic spectrum. In some examples, the wavelength range can be a narrow wavelength range, such as provided by lasers. In one example, the wavelength range includes wavelengths that are approximately between 1545 nm and 1555 nm. It is noted that this range is described for exemplary purposes only and is not meant to be limiting.

In accordance with the present disclosure, one of the light sources 106 may be a fiber laser that includes an optical amplifier. In particular, the fiber laser may be a laser in which an active gain medium (i.e., a source of optical gain within the laser) is in an optical fiber. Moreover, the fiber laser could be arranged in various ways within the LIDAR device 100. For instance, the fiber laser could be disposed between the rotating platform 114 and the first receiver 110.

In some arrangements, the one or more light sources 106 may additionally or alternatively include laser diodes, light emitting diodes (LED), vertical cavity surface emitting lasers (VCSEL), organic light emitting diodes (OLED), polymer light emitting diodes (PLED), light emitting polymers (LEP), liquid crystal displays (LCD), microelectromechanical systems (MEMS), and/or any other device configured to selectively transmit, reflect, and/or emit light to provide the plurality of emitted light beams and/or pulses.

In some embodiments, transmitter 108 may be configured to emit light into an environment. In particular, the transmitter 108 may include an optical arrangement that is arranged to direct light from a light source 106 toward the environment. This optical arrangement may include any feasible combination of mirror(s) used to guide propagation of the light throughout physical space and/or lens(es) used to adjust certain characteristics of the light, among other optical components. For instance, the optical arrangement may include a transmit lens arranged to collimate the light, thereby resulting in light having rays that are substantially parallel to one another.

In some implementations, the optical arrangement may also include a diffuser arranged to spread the light along a vertical axis. In practice, the diffuser may be formed from glass or another material, and may be shaped (e.g., aspherical shape) to spread or otherwise scatter light in a particular manner. For instance, the vertical spread may be a spread of +7° away from a horizontal axis to −18° away from the horizontal axis (e.g., the horizontal axis ideally being parallel to a ground surface in the environment). Moreover, the diffuser may be coupled to a light source 106 in any direct or indirect manner, such as by being fused to an output end of the fiber laser for instance.

Thus, this implementation may result in laser beams or the like having horizontal beam width (e.g., 1 mm) that is significantly narrower than a vertical beam width of the laser beams. As noted, such horizontally-narrow laser beams may help avoid interference between beams reflected off a reflective object and beams reflected off a less-reflective object that is horizontally adjacent to the reflective object, which may ultimately help the LIDAR device 100 distinguish between those objects. Other advantages are possible as well.

Yet further, in some implementations, the optical arrangement may also include a dichroic mirror arranged to reflect at least a portion of the diffused light towards a thermal energy measurement device (not shown) of the LIDAR device 100, which could take the form of a thermopile for instance. With this implementation, the thermal energy measurement device could be arranged to measure energy of the light being emitted towards the environment. And data related to that energy measurement could be received by a controller and then used by the controller as basis for facilitating further operations, such as adjustments to intensity of the emitted light for example. Other implementations are also possible.

As noted, the LIDAR device 100 may include a first receiver 110 and a second receiver 112. Each such receiver may be respectively configured to detect light having wavelengths in the same wavelength range as the one of the light emitted from the transmitter 108 (e.g., 1545 nm to 1555 nm). In this way, the LIDAR device 100 may distinguish reflected light pulses originated at the LIDAR device 100 from other light in the environment.

In accordance with the present disclosure, the first receiver 110 may be configured to detect light with a first resolution and the second receiver 112 may be configured to detect light with a second resolution that is lower than the first resolution. For example, the first receiver 110 may be configured to detect light with a 0.036° (horizontal)×0.067° (vertical) angular resolution, and the second receiver 112 may be configured to detect light with a 0.036° (horizontal)× 0.23° (vertical) angular resolution.

Additionally, the first receiver 110 may be configured to scan the environment with a first field of view (FOV) and the second receiver 112 may be configured to scan the environment with a second FOV that is at least partially different from the first FOV. Generally, this arrangement may allow the LIDAR device 100 to scan different portions of the environment respectively at different resolutions, which may be applicable in various situations as further discussed below. For instance, the different FOVs of the receivers at issue may be at least partially different vertical FOVs that collectively allow for detection of light substantially along the same angular range as the above-mentioned vertical spread of the emitted light.

In some implementations, the first receiver 110 may be arranged to focus incoming light within a range of +7° away from the above-mentioned horizontal axis to −7° away from the horizontal axis, and the second receiver 112 may be arranged to focus incoming light within a range of −7° away from the horizontal axis to −18° away from the horizontal axis. In this way, the first and second receivers 110-112 collectively allow for detection of light along a range of +7° to −18°, which matches the above-mentioned exemplary vertical spread of light that the transmitter 108 provides. It is noted that these resolutions and FOVs are described for exemplary purposes only and are not meant to be limiting.

In an example implementation, the first and second receivers 110-112 may each have a respective optical arrangement that allows the receiver to provide the respective resolution and FOV as described above. Generally, each such optical arrangement may be arranged to respectively provide an optical path between at least one optical lens and a photodetector array.

In one implementation, the first receiver 110 may include an optical lens arranged to focus light reflected from one or more objects in the environment of the LIDAR device 100 onto detectors of the first receiver 110. To do so, the optical lens may have dimensions of approximately 10 cm×5 cm as well as a focal length of approximately 35 cm, for example. Moreover, the optical lens may be shaped so as to focus incoming light along a particular vertical FOV as described above (e.g., +7° to −7°). Such shaping of the first receiver's optical lens may take on one of various forms (e.g., spherical shaping) without departing from the scope of the present disclosure.

In this implementation, the first receiver 110 may also include at least one mirror arranged to fold the optical path between the at least one optical lens and the photodetector array. Each such mirror may be fixed within the first receiver 110 in any feasible manner. Also, any feasible number of mirrors may be arranged for purposes of folding the optical path. For instance, the first receiver 110 may also include two or more mirrors arranged to fold the optical path two or more times between the optical lens and the photodetector array. In practice, such folding of the optical path may help reduce the size of the first receiver, among other outcomes.

In another implementation, the first receiver 110 may include two or more optical lenses. For example, the first receiver 110 may include an outer spherically-shaped lens facing the environment as well as an inner cylindrically-shaped lens. In this example, incoming light may thus be focused onto a line on a focal plane. Other examples and implementations are possible as well.

Furthermore, as noted, the first receiver may have a photodetector array, which may include two or more detectors each configured to convert detected light (e.g., in the above-mentioned wavelength range) into an electrical signal indicative of the detected light. In practice, such a photodetector array could be arranged in one of various ways. For example, the detectors can be disposed on one or more substrates (e.g., printed circuit boards (PCBs), flexible PCBs, etc.) and arranged to detect incoming light that is traveling along the optical path from the optical lens. Also, such a photodetector array could include any feasible number of detectors aligned in any feasible manner. For example, the photodetector array may include a 13×16 array of detectors. It is noted that this photodetector array is described for exemplary purposes only and is not meant to be limiting.

Generally, the detectors of the array may take various forms. For example, the detectors may take the form of photodiodes, avalanche photodiodes, phototransistors, cameras, active pixel sensors (APS), charge coupled devices (CCD), cryogenic detectors, and/or any other sensor of light configured to receive focused light having wavelengths in the wavelength range of the emitted light. Other examples are possible as well.

With regards to the second receiver 112, the second receiver 112 may also include at least one optical lens arranged to focus light reflected from one or more objects in the environment of the LIDAR device 100 onto detectors of the first receiver 110. To do so, the optical lens may have any dimensions, focal length, and shaping that help provide for focusing of incoming light along a particular vertical FOV as described above (e.g., −7° to −18°). In some implementations, the second receiver 112 may include one or more mirrors arranged to fold the optical path between the second receiver's optical lens and the second receiver's photodetector array. Further, the second receiver's photodetector array may include any feasible number of detectors arranged in any of the ways described above in the context of the first receiver 110. Other implementations are possible as well.

Further, as noted, the LIDAR device 100 may include a rotating platform 114 that is configured to rotate about an axis. In order to rotate in this manner, one or more actuators 116 may actuate the rotating platform 114. In practice, these actuators 116 may include motors, pneumatic actuators, hydraulic pistons, and/or piezoelectric actuators, among other possibilities. In some embodiments, the rotating platform 114 may be integrated with or may form part of a rotor of a thermal rotary link disclosed herein.

In accordance with the present disclosure, the transmitter 108 and the first and second receivers 110-112 may be arranged on the rotating platform such that each of these components moves relative to the environment based on rotation of the rotating platform 114. In particular, each of these components could be rotated relative to an axis so that the LIDAR device 100 may obtain information from various directions. In this manner, the LIDAR device 100 may have a horizontal viewing direction that can be adjusted by actuating the rotating platform 114 to different directions.

With this arrangement, a controller could direct an actuator 116 to rotate the rotating platform 114 in various ways to obtain information about the environment in various ways. In particular, the rotating platform 114 could rotate at various extents and in either direction. For example, the rotating platform 114 may carry out full revolutions such that the LIDAR device 100 provides a 360° horizontal FOV of the environment. Thus, given that the first and second receivers 110-112 may both rotate based on rotation of the rotating platform 114, both receivers 110-112 may have the same horizontal FOV (e.g., 360°) while having different vertical FOV as described above.

Moreover, the rotating platform 114 could rotate at various rates so as to cause LIDAR device 100 to scan the environment at various refresh rates. For example, the LIDAR device 100 may be configured to have a refresh rate of 15 Hz (e.g., fifteen complete rotations of the LIDAR device 100 per second). In this example, assuming that the LIDAR device 100 is coupled to a vehicle as further described below, the scanning thus involves scanning a 360° FOV around the vehicle fifteen times every second. Other examples are also possible.

Yet further, as noted, the LIDAR device 100 may include a stationary platform 118. In practice, the stationary platform may take on any shape or form and may be configured for coupling to various structures, such as to a top of a vehicle for example. Also, the coupling of the stationary platform may be carried out via any feasible connector arrangement (e.g., bolts and/or screws). In this way, the LIDAR device 100 could be coupled to a structure to be used for various purposes, such as those described herein.

In some embodiments, the stationary platform 118 may be integrated with or may form part of a stator of a thermal rotary link disclosed herein. Heat generated by electronic, optical, and mechanical components of LIDAR device 100 may be transferred away from LIDAR device 100 by way of the thermal rotary link. In particular, the thermal rotary link may transfer heat from the rotating platform 114 to stationary platform 118. Stationary platform 118 may include and/or may be in thermal contact with a cooling device to absorb heat from the LIDAR device 100.

In accordance with the present disclosure, the LIDAR device 100 may also include a rotary joint 120 that directly or indirectly couples the stationary platform 118 to the rotating platform 114. Specifically, the rotary joint 120 may take on any shape, form and material that provides for rotation of the rotating platform 114 about an axis relative to the stationary platform 118. For instance, the rotary joint 120 may take the form of a shaft or the like that rotates based on actuation from an actuator 116, thereby transferring mechanical forces from the actuator 116 to the rotating platform 114. Moreover, as noted, the rotary joint may have a central cavity in which electronics 104 and/or one or more other components of the LIDAR device 100 may be disposed. The rotary joint 120 may form part of the thermal rotary link and may provide for rotation of the rotor with respect to the stator. Other arrangements are possible as well.

Yet further, as noted, the LIDAR device 100 may include a housing 122. In practice, the housing 122 may take on any shape, form, and material. For example, the housing 122 can be a dome-shaped housing, among other possibilities. In another example, the housing 122 may be composed of a material that is at least partially non-transparent, which may allow for blocking of at least some light from entering the interior space of the housing 122 and thus help mitigate thermal effects as further discussed below. It is noted that this housing is described for exemplary purposes only and is not meant to be limiting.

In accordance with the present disclosure, the housing 122 may be coupled to the rotating platform 114 such that the housing 122 is configured to rotate about the above-mentioned axis based on rotation of the rotating platform 114. With this implementation, the transmitter 108, the first and second receiver 110-112, and possibly other components of the LIDAR device 100 may each be disposed within the housing 122. In this manner, the transmitter 108 and the first and second receiver 110-112 may rotate along with this housing 122 while being disposed within the housing 122.

Moreover, the housing 122 may have an aperture formed thereon, which could take on any feasible shape and size. In this regard, the transmitter 108 could be arranged within the housing 120 so as to emit light into the environment through the aperture. In this way, the transmitter 108 may rotate along with the aperture due to corresponding rotation of the housing 120, thereby allowing for emission of light into various directions. Also, the first and second receiver 110-112 could each be respectively arranged within the housing 120 so as respectively detect light that enters the housing 120 from the environment through the aperture. In this way, the receivers 110-112 may rotate along with the aperture due to corresponding rotating of the housing 120, thereby allowing for detection of the light incoming from various directions along the horizontal FOV.

In practice, the housing 122 may be arranged as described above for various reasons. Specifically, due to various components of the LIDAR device 100 being disposed within the housing 122 and due to the housing 122 rotating along with those components, the housing 122 may help protect those components from various environmental hazards, such as rain and/or snow, among others. Also, if the housing 122 were to be stationary as the LIDAR device 100 rotates within the housing 122, then the housing 122 would likely be transparent so as to allow for propagation of light through the housing 122 and thus for scanning of the environment by the LIDAR device 100.

In accordance with the present disclosure, however, the housing 122 may have the aperture that rotates along with the LIDAR device 100, which means that the housing 122 does not necessarily need to be fully transparent to allow for scanning of the scanning of the environment. For example, the housing 122 could be composed of at least a partially non-transparent material, except for the aperture, which could be composed of a transparent material. As a result, the housing 122 may help mitigate thermal effects on the LIDAR device 100. For instance, the housing 122 may block sun rays from entering the interior space of the housing 122, which may help avoid overheating of various components of the LIDAR device 100 due to those sun rays. Other instances are possible as well.

Given the various components of the LIDAR device 100 as described above, these various components could be arranged in various ways. In accordance with the present disclosure, assuming that the LIDAR device 100 is spatially oriented such that the stationary platform 118 is closest to a ground surface, the LIDAR device 100 may be arranged such that (i) the first receiver 110 is positioned substantially above the stationary platform 118, (ii) the second receiver 112 and the transmitter 108 are both positioned substantially above the first receiver 110, and (iii) the second receiver 112 is positioned substantially horizontally adjacent to the transmitter 108. However, it is noted that this arrangement is described for exemplary purposes only and is not meant to be limiting.

III. Example Vehicle System

Figure 2:
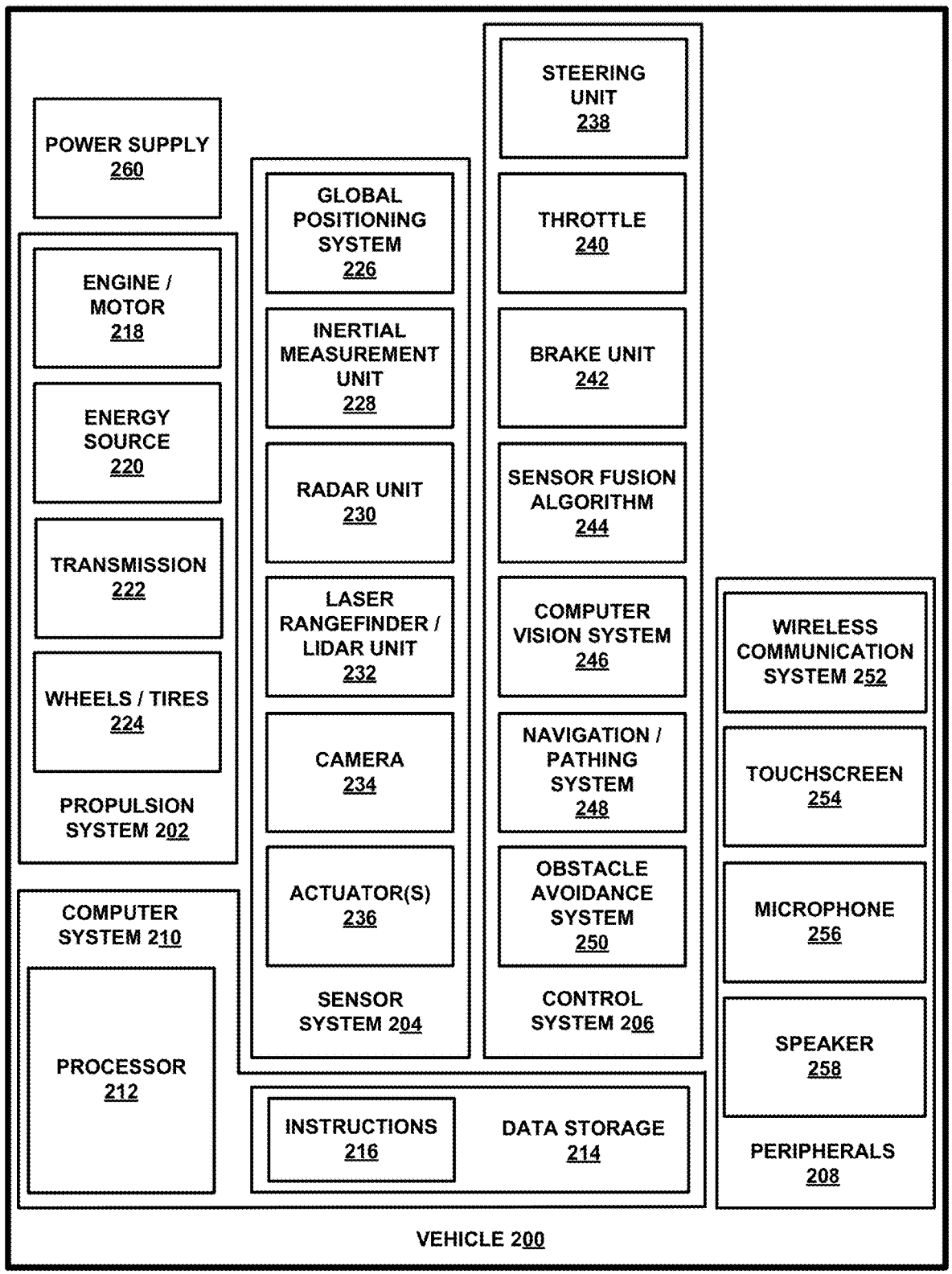
FIG. 2 illustrates a simplified block diagram of a vehicle, according to an example embodiment.

FIG. 2 is a simplified block diagram of a vehicle 200, according to an example embodiment. The vehicle 200 may include a LIDAR device similar to the LIDAR device 100. As shown, the vehicle 200 includes a propulsion system 202, a sensor system 204, a control system 206 (could also be referred to as a controller 206), peripherals 208, and a computer system 210. In other embodiments, the vehicle 200 may include more, fewer, or different systems, and each system may include more, fewer, or different components.

Additionally, the systems and components shown may be combined or divided in any number of ways. For instance, the control system 206 and the computer system 210 may be combined into a single system that operates the vehicle 200 in accordance with various operations.

The propulsion system 202 may be configured to provide powered motion for the vehicle 200. As shown, the propulsion system 202 includes an engine/motor 218, an energy source 220, a transmission 222, and wheels/tires 224.

The engine/motor 218 may be or include any combination of an internal combustion engine, an electric motor, a steam engine, and a Sterling engine. Other motors and engines are possible as well. In some embodiments, the propulsion system 202 may include multiple types of engines and/or motors. For instance, a gas-electric hybrid car may include a gasoline engine and an electric motor. Other examples are possible.

The energy source 220 may be a source of energy that powers the engine/motor 218 in full or in part. That is, the engine/motor 918 may be configured to convert the energy source 220 into mechanical energy. Examples of energy sources 220 include gasoline, diesel, propane, other compressed gas-based fuels, ethanol, solar panels, batteries, and other sources of electrical power. The energy source(s) 220 may additionally or alternatively include any combination of fuel tanks, batteries, capacitors, and/or flywheels. In some embodiments, the energy source 220 may provide energy for other systems of the vehicle 200 as well.

The transmission 222 may be configured to transmit mechanical power from the engine/motor 218 to the wheels/tires 224. To this end, the transmission 222 may include a gearbox, clutch, differential, drive shafts, and/or other elements. In embodiments where the transmission 222 includes drive shafts, the drive shafts may include one or more axles that are configured to be coupled to the wheels/tires 224.

The wheels/tires 224 of vehicle 200 may be configured in various formats, including a unicycle, bicycle/motorcycle, tricycle, or car/truck four-wheel format. Other wheel/tire formats are possible as well, such as those including six or more wheels. In any case, the wheels/tires 224 may be configured to rotate differentially with respect to other wheels/tires 224. In some embodiments, the wheels/tires 224 may include at least one wheel that is fixedly attached to the transmission 222 and at least one tire coupled to a rim of the wheel that could make contact with the driving surface. The wheels/tires 224 may include any combination of metal and rubber, or combination of other materials. The propulsion system 202 may additionally or alternatively include components other than those shown.

The sensor system 204 may include a number of sensors configured to sense information about an environment in which the vehicle 200 is located, as well as one or more actuators 236 configured to modify a position and/or orientation of the sensors. As shown, the sensors of the sensor system 204 include a Global Positioning System (GPS) 226, an inertial measurement unit (IMU) 928, a RADAR unit 230, a laser rangefinder and/or LIDAR unit 232, and a camera 234. The sensor system 204 may include additional sensors as well, including, for example, sensors that monitor internal systems of the vehicle 200 (e.g., an $O_2$ monitor, a fuel gauge, an engine oil temperature, etc.). Other sensors are possible as well.

The GPS 226 may be any sensor (e.g., location sensor) configured to estimate a geographic location of the vehicle 200. To this end, the GPS 226 may include a transceiver configured to estimate a position of the vehicle 200 with respect to the Earth. The GPS 226 may take other forms as well.

The IMU 228 may be any combination of sensors configured to sense position and orientation changes of the vehicle 200 based on inertial acceleration. In some embodiments, the combination of sensors may include, for example, accelerometers and gyroscopes. Other combinations of sensors are possible as well.

The RADAR unit 230 may be any sensor configured to sense objects in the environment in which the vehicle 200 is located using radio signals. In some embodiments, in addition to sensing the objects, the RADAR unit 230 may additionally be configured to sense the speed and/or heading of the objects.

Similarly, the laser range finder or LIDAR unit 232 may be any sensor configured to sense objects in the environment in which the vehicle 200 is located using lasers. For example, LIDAR unit 232 may include one or more LIDAR devices, at least some of which may take the form the LIDAR device 100 disclosed herein.

The camera 234 may be any camera (e.g., a still camera, a video camera, etc.) configured to capture images of the environment in which the vehicle 200 is located. To this end, the camera may take any of the forms described above. The sensor system 204 may additionally or alternatively include components other than those shown.

The control system 206 may be configured to control operation of the vehicle 200 and its components. To this end, the control system 206 may include a steering unit 238, a throttle 240, a brake unit 242, a sensor fusion algorithm 244, a computer vision system 246, a navigation or pathing system 248, and an obstacle avoidance system 250.

The steering unit 238 may be any combination of mechanisms configured to adjust the heading of vehicle 200. The throttle 240 may be any combination of mechanisms configured to control the operating speed of the engine/motor 218 and, in turn, the speed of the vehicle 200. The brake unit 242 may be any combination of mechanisms configured to decelerate the vehicle 200. For example, the brake unit 242 may use friction to slow the wheels/tires 224. As another example, the brake unit 242 may convert the kinetic energy of the wheels/tires 224 to electric current. The brake unit 242 may take other forms as well.

The sensor fusion algorithm 244 may be an algorithm (or a computer program product storing an algorithm) configured to accept data from the sensor system 204 as an input. The data may include, for example, data representing information sensed at the sensors of the sensor system 204. The sensor fusion algorithm 244 may include, for example, a Kalman filter, a Bayesian network, an algorithm for some of the functions of the methods herein, or any another algorithm. The sensor fusion algorithm 244 may further be configured to provide various assessments based on the data from the sensor system 204, including, for example, evaluations of individual objects and/or features in the environment in which the vehicle 200 is located, evaluations of particular situations, and/or evaluations of possible impacts based on particular situations. Other assessments are possible as well.

The computer vision system 246 may be any system configured to process and analyze images captured by the camera 234 in order to identify objects and/or features in the environment in which the vehicle 200 is located, including, for example, traffic signals and obstacles. To this end, the computer vision system 246 may use an object recognition algorithm, a Structure from Motion (SFM) algorithm, video tracking, or other computer vision techniques. In some embodiments, the computer vision system 246 may additionally be configured to map the environment, track objects, estimate the speed of objects, etc.

The navigation and pathing system 248 may be any system configured to determine a driving path for the vehicle 200. The navigation and pathing system 248 may additionally be configured to update the driving path dynamically while the vehicle 200 is in operation. In some embodiments, the navigation and pathing system 248 may be configured to incorporate data from the sensor fusion algorithm 244, the GPS 226, the LIDAR unit 232, and one or more predetermined maps so as to determine the driving path for vehicle 200.

The obstacle avoidance system 250 may be any system configured to identify, evaluate, and avoid or otherwise negotiate obstacles in the environment in which the vehicle 200 is located. The control system 206 may additionally or alternatively include components other than those shown.

Peripherals 208 may be configured to allow the vehicle 200 to interact with external sensors, other vehicles, external computing devices, and/or a user. To this end, the peripherals 208 may include, for example, a wireless communication system 252, a touchscreen 254, a microphone 256, and/or a speaker 258.

The wireless communication system 252 may be any system configured to wirelessly couple to one or more other vehicles, sensors, or other entities, either directly or via a communication network. To this end, the wireless communication system 252 may include an antenna and a chipset for communicating with the other vehicles, sensors, servers, or other entities either directly or via a communication network. The chipset or wireless communication system 252 in general may be arranged to communicate according to one or more types of wireless communication (e.g., protocols) such as Bluetooth, communication protocols described in IEEE 802.11 (including any IEEE 802.11 revisions), cellular technology (such as GSM, CDMA, UMTS, EV-DO, WiMAX, or LTE), Zigbee, dedicated short range communications (DSRC), and radio frequency identification (RFID) communications, among other possibilities. The wireless communication system 252 may take other forms as well.

The touchscreen 254 may be used by a user to input commands to the vehicle 200. To this end, the touchscreen 254 may be configured to sense at least one of a position and a movement of a user's finger via capacitive sensing, resistance sensing, or a surface acoustic wave process, among other possibilities. The touchscreen 254 may be capable of sensing finger movement in a direction parallel or planar to the touchscreen surface, in a direction normal to the touchscreen surface, or both, and may also be capable of sensing a level of pressure applied to the touchscreen surface. The touchscreen 254 may be formed of one or more translucent or transparent insulating layers and one or more translucent or transparent conducting layers. The touchscreen 254 may take other forms as well.

The microphone 256 may be configured to receive audio (e.g., a voice command or other audio input) from a user of the vehicle 200. Similarly, the speakers 258 may be configured to output audio to the user of the vehicle 200. The peripherals 208 may additionally or alternatively include components other than those shown.

The computer system 210 may be configured to transmit data to, receive data from, interact with, and/or control one or more of the propulsion system 202, the sensor system 204, the control system 206, and the peripherals 208. To this end, the computer system 210 may be communicatively linked to one or more of the propulsion system 202, the sensor system 204, the control system 206, and the peripherals 208 by a system bus, network, and/or other connection mechanism (not shown).

In one example, the computer system 210 may be configured to control operation of the transmission 222 to improve fuel efficiency. As another example, the computer system 210 may be configured to cause the camera 234 to capture images of the environment. As yet another example, the computer system 210 may be configured to store and execute instructions corresponding to the sensor fusion algorithm 244. As still another example, the computer system 210 may be configured to store and execute instructions for determining a 3D representation of the environment around the vehicle 200 using the LIDAR unit 232. Other examples are possible as well. Thus, the computer system 210 could function as the controller for the LIDAR unit 232.

As shown, the computer system 210 includes the processor 212 and data storage 214. The processor 212 may comprise one or more general-purpose processors and/or one or more special-purpose processors. To the extent the processor 212 includes more than one processor, such processors could work separately or in combination. Data storage 214, in turn, may comprise one or more volatile and/or one or more non-volatile storage components, such as optical, magnetic, and/or organic storage, and data storage 214 may be integrated in whole or in part with the processor 212.

In some embodiments, data storage 214 may contain instructions 216 (e.g., program logic) executable by the processor 212 to execute various vehicle functions (e.g., methods 500, etc.). Data storage 214 may contain additional instructions as well, including instructions to transmit data to, receive data from, interact with, and/or control one or more of the propulsion system 202, the sensor system 204, the control system 206, and/or the peripherals 208. The computer system 210 may additionally or alternatively include components other than those shown.

As shown, the vehicle 200 further includes a power supply 220, which may be configured to provide power to some or all of the components of the vehicle 200. To this end, the power supply 220 may include, for example, a rechargeable lithium-ion or lead-acid battery. In some embodiments, one or more banks of batteries could be configured to provide electrical power. Other power supply materials and configurations are possible as well. In some embodiments, the power supply 220 and energy source 220 may be implemented together as one component, as in some all-electric cars.

In some embodiments, the vehicle 200 may include one or more elements in addition to or instead of those shown. For example, the vehicle 200 may include one or more additional interfaces and/or power supplies. Other additional components are possible as well. In such embodiments, data storage 214 may further include instructions executable by the processor 212 to control and/or communicate with the additional components.

Still further, while each of the components and systems are shown to be integrated in the vehicle 200, in some embodiments, one or more components or systems may be removably mounted on or otherwise connected (mechanically or electrically) to the vehicle 200 using wired or wireless connections. The vehicle 200 may take other forms as well.

Figure 3:
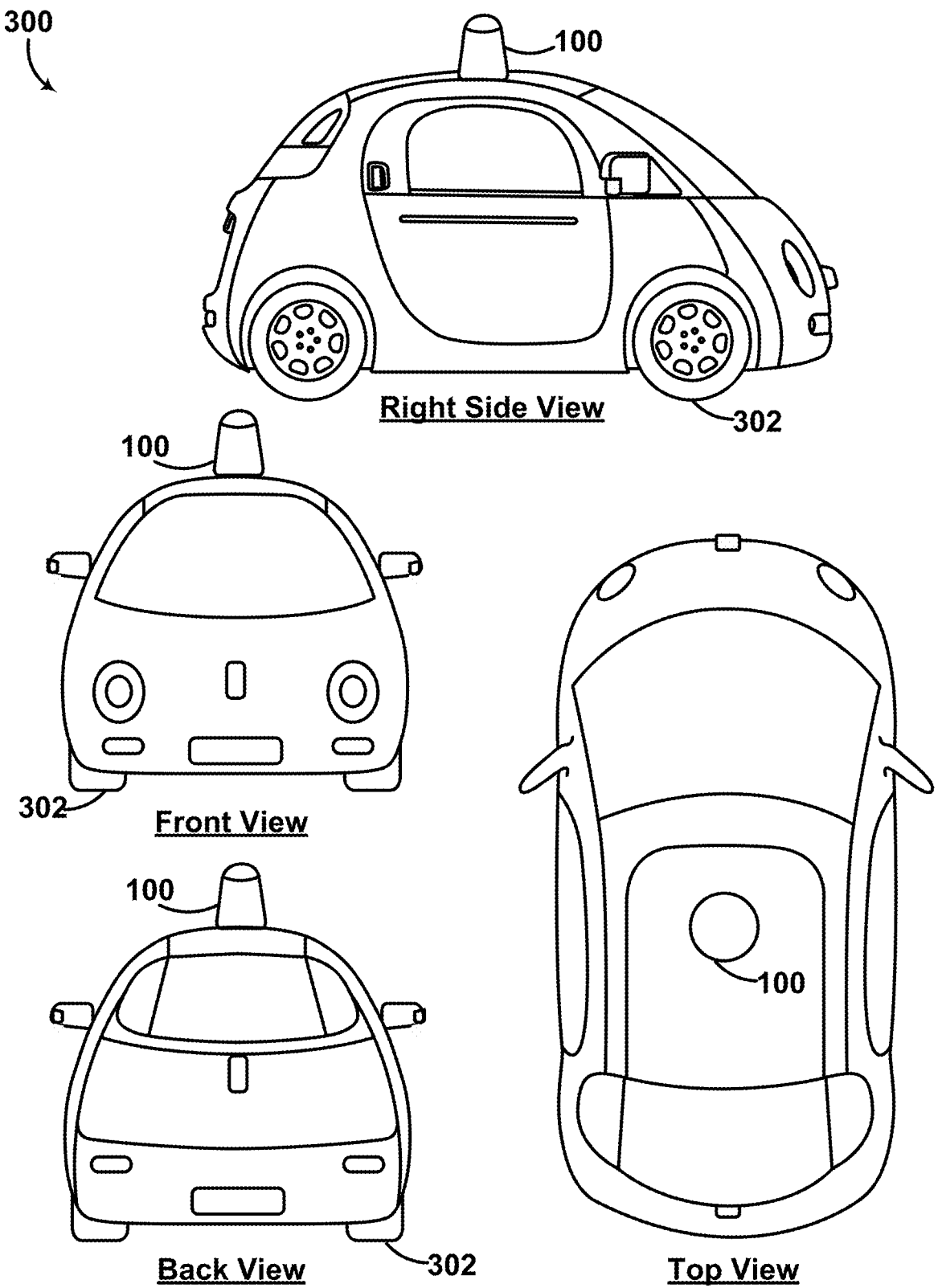
FIG. 3 illustrates several views of a LIDAR device positioned on top of a vehicle, according to an example embodiment.

FIG. 3 shows a Right Side View, Front View, Back View, and Top View of the vehicle 300. As shown, the vehicle 300 includes the LIDAR device 100 being positioned on a top side of the vehicle 300 opposite a bottom side on which wheels 302 of the vehicle 300 are located. Although the LIDAR device 100 is shown and described as being positioned on the top side of the vehicle 300, the LIDAR device 100 could be positioned on any part feasible portion of the vehicle without departing from the scope of the present disclosure.

Moreover, the LIDAR device 100 may be configured to scan an environment around the vehicle 300 (e.g., at a refresh rate of 15 Hz) by rotating about the vertical axis while emitting one or more light pulses and detecting reflected light pulses off objects in the environment of the vehicle 300, for example.

IV. Example Thermal Rotary Link System

Figure 4:
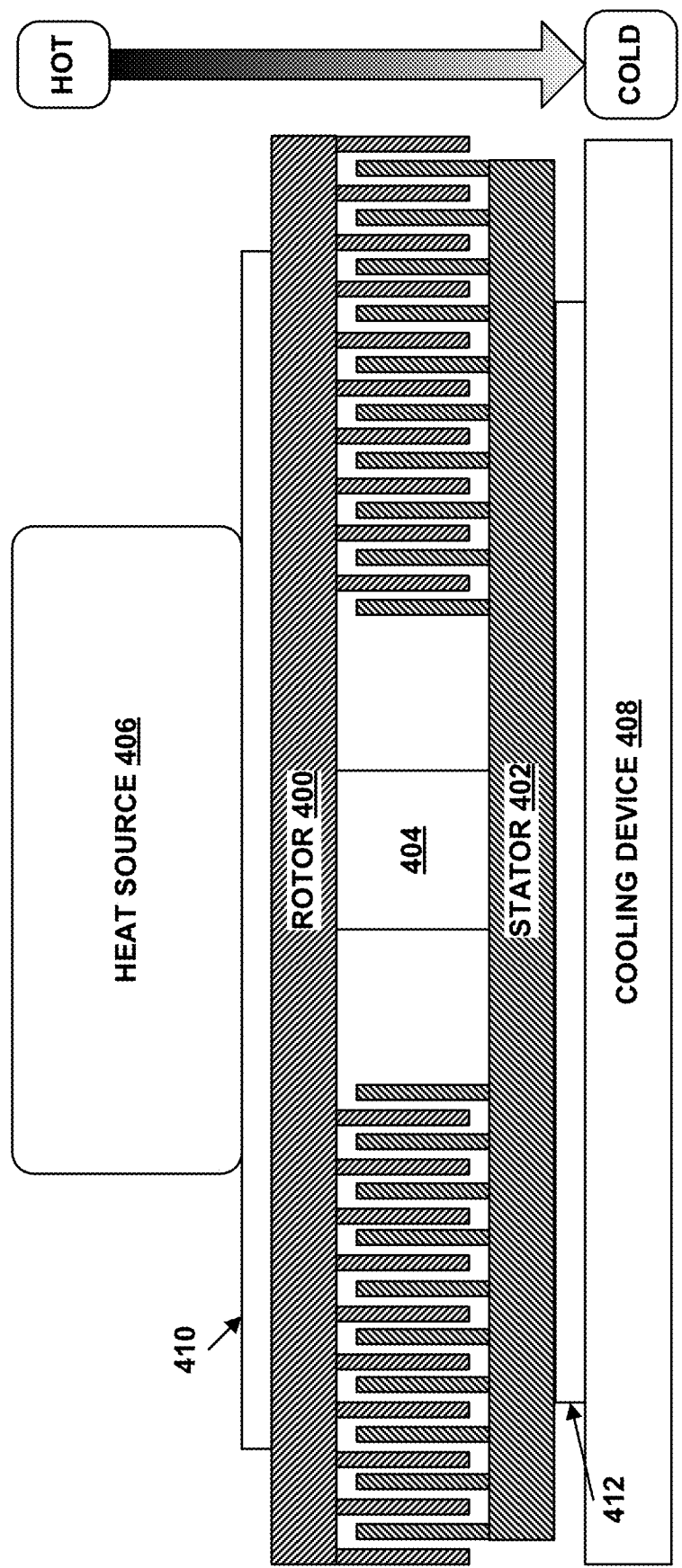
FIG. 4 illustrates an example heat transfer system including a thermal rotary link, according to an example embodiment.

FIG. 4 illustrates a cross-section of an example thermal rotary link apparatus for transferring heat from a heat source 406 to a cooling device 408 (e.g., cold plate). The thermal rotary link may include a rotor 400 connected to a stator 402 through a rotational joint 404. Rotational joint 404 may provide for rotation of rotor 400 with respect to stator 402. Heat source 406 may be thermally and/or mechanically coupled to rotor 400 by way of coupling 410. Similarly, cooling device 408 may be thermally and/or mechanically coupled to stator 402. Stator 402 and rotor 400 may each include a plurality of fins protruding perpendicularly therefrom. The plurality of fins of the rotor and the stator may be arranged in concentric circles radially offset from one another by distances that provide for the plurality of fins of the stator 402 to interpose with the plurality of fins of the rotor 400 to transfer heat from rotor 400 to stator 402.

Thus, the thermal rotary link may provide a thermally conductive rotational connection between heat source 406 and cooling device 408. In general, the thermal rotary link may be used to transfer heat between any devices, objects, or systems that are in rotational motion with respect to one another. For example, such a thermal rotary connection may be useful for cooling a rotating heat source such as a rotating LIDAR device.

Within examples, heat source 406 could be a LIDAR device or any electronic, optical, mechanical, or electromechanical device, system, or object that generates heat during operation either intentionally or as a byproduct. Cooling device 408 may be any active or passive device or system configured to absorb and/or dissipate heat. Heat source 406 may be at a higher temperature than cooling device 408 to induce heat flow from the heat source 406 to the cooling device 408.

Figure 5A:
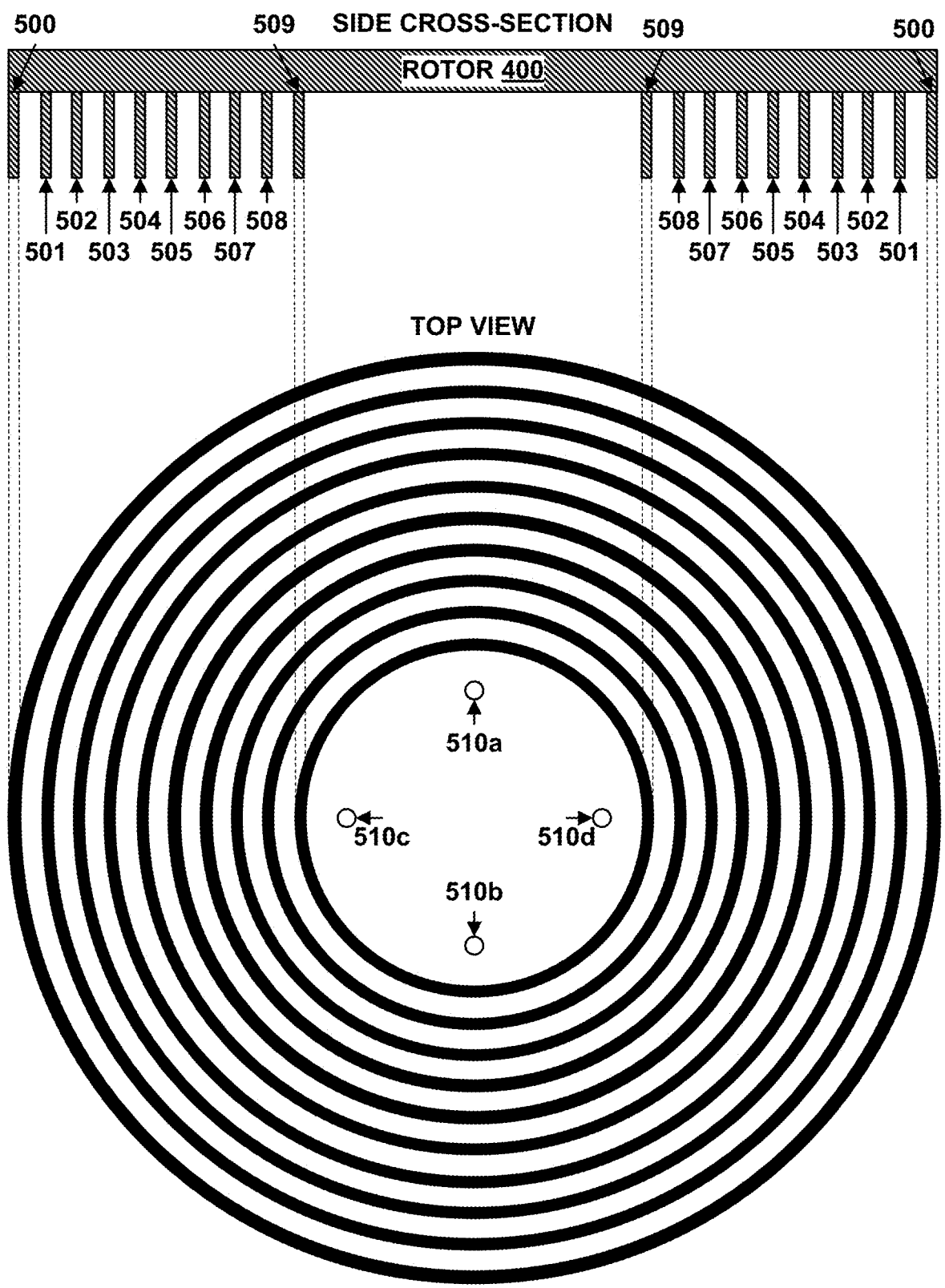
FIG. 5A illustrates an example rotor, according to an example embodiment.

FIG. 5A illustrates a side cross-sectional view aligned with a corresponding top view of rotor 400. In one embodiment, rotor 400 may include a planar circular plate, as shown in the top view of FIG. 5A. However, in other embodiments, the rotor may include a planar plate in various other regular or irregular geometric shapes (e.g., rectangle, ellipse, octagon, etc.). A plurality of fins 500, 501, 502, 503, 504, 505, 506, 507, 508, and 509 (i.e., fins 500-509) may be integral with and may protrude perpendicularly from one side of the plate. Within examples, "planar" and "perpendicular" are herein defined to encompass deviations from exact planarity and exact perpendicularity, respectively, resulting from (i) variations in tolerances of manufacturing processes employed in production of components of the system, (ii) deflections and other structural deviations resulting from stresses during normal operation of the system, and (iii) any other deviations that do not hinder or prevent the operations of the thermal rotary link herein described.

The plurality of fins 500-509 may be arranged in concentric circles, as illustrated in the top view of rotor 400. In some embodiments, each fin of the plurality of fins 500-509 may extend continuously about the circumference of a respective concentric circle. Thus, in the cross-sectional view, the leftmost and rightmost fin 500, for example, may be a single fin extending about the circumference of the circular plate forming rotor 400.

Rotor 400 and fins 500-509 may comprise a metallic material with a high thermal conductivity such as aluminum or copper. In some example embodiments, the rotor 400 and the plurality of fins 500-509 may be manufactured as one piece by, for example, forging, die casting, milling, or turning on a lathe, among other possibilities. In alternative embodiments, the plate and the plurality of fins 500-509 may be manufactured as separate pieces that may be welded, swaged, press-fitted, screwed, glued, stamped, and/or bolted together. Regardless of the manufacturing process employed, the plurality of fins 500-509 may be fixedly connected to (i.e., be integral with) the planar plate of rotor 400 to establish thermal contact between the plurality of fins 500-509 and the plate.

In some example embodiments, rotor 400 may include mounting holes 510a, 510b, 510c, and 510d for interfacing the rotor 400 with the heat source 406. Mounting holes 510a-510d may provide for mounting of rotor 400 to heat source 406 directly or by way of coupling 410. In alternative implementations, the size, number, and spacing of mounting holes 510a-510d may be tailored to the specific type and size of heat source 406.

Figure 5B:
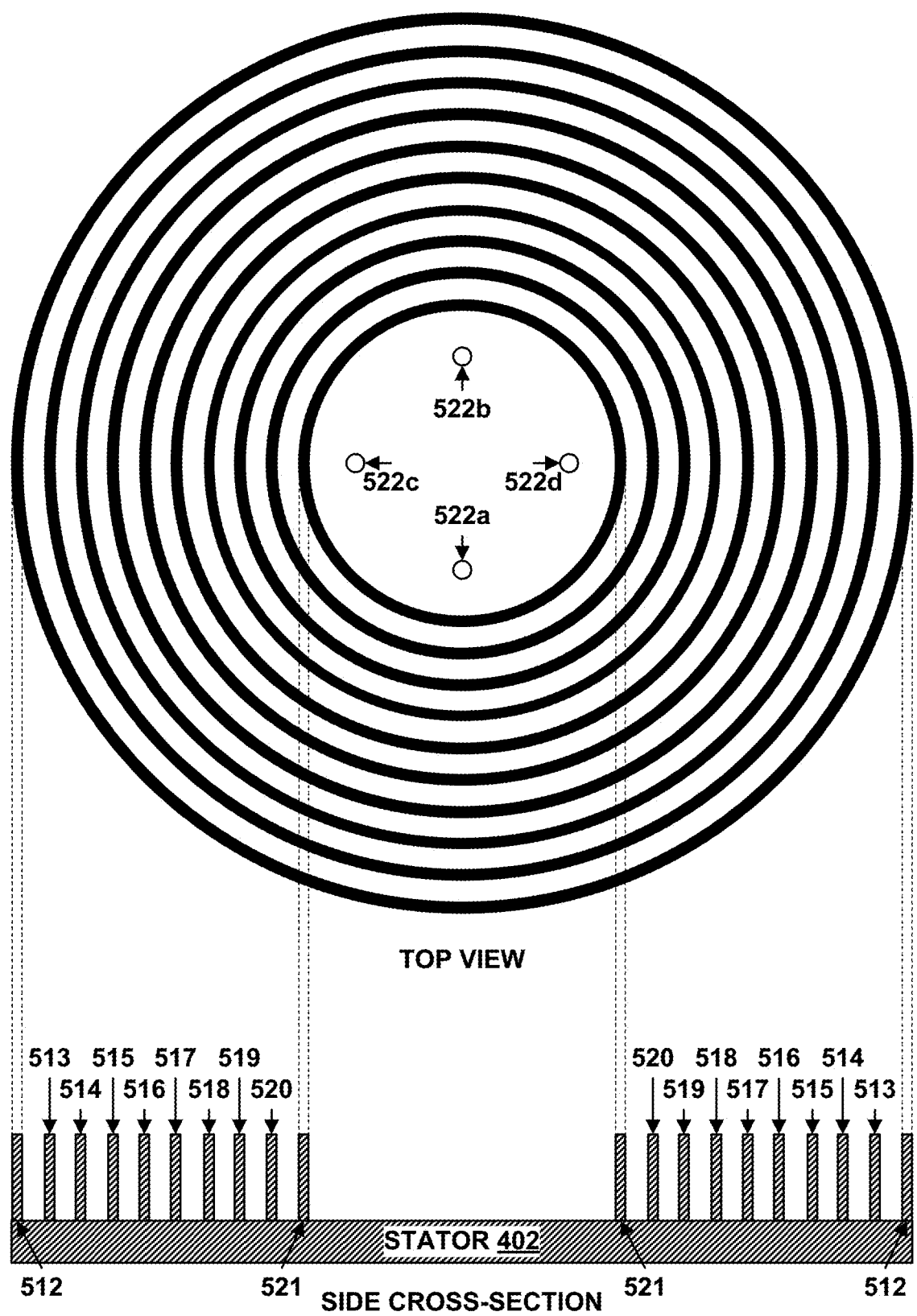
FIG. 5B illustrates an example stator, according to an example embodiment.

FIG. 5B illustrates a side cross-sectional view aligned with a corresponding top view of stator 402. Much like rotor 400, stator 402 may, in one example embodiment, include a planar circular plate, as shown in the top view of FIG. 5B. However, in other embodiments, the rotor may include a planar plate in various other regular or irregular geometric shapes. A plurality of fins 512, 513, 514, 515, 516, 517, 518, 519, 520, and 521 (i.e., fins 512-521) may be integral with and may protrude perpendicularly from one side of the plate of stator 402.

The plurality of fins 512-521 may be arranged in concentric circles, as illustrated in the top view of stator 402. In some embodiments, each fin of the plurality of fins 500-509 may extend continuously about the circumference of a respective concentric circle. Like rotor 400, stator 402 and fins 512-521 thereof may comprise a metallic material with a high thermal conductivity such as aluminum or copper. The stator 402 and the plurality of fins 512-521 may be manufactured as one piece or as multiple pieces that are fixedly joined together, as described above. Regardless of the manufacturing process employed, the plurality of fins 512-521 may be fixedly connected to (i.e., be integral with) the planar plate of stator 402 to establish thermal contact between the plurality of fins 512-521 and the plate.

In some example embodiments, stator 402 may include mounting holes 522a, 522b, 522c, and 522d for interfacing the stator 402 with the cooling device 408. Mounting holes 510a-510d may provide for mounting of stator 402 to cooling device 408 directly or by way of coupling 412. In alternative implementations, the size, number, and spacing of mounting holes 522a-522d may be tailored to the specific type and size of cooling device 408.

When rotor 400 and stator 402 are rotatably connected to one another, the plurality of fins 500-509 of the rotor 400 may interpose with the plurality of fins 512-521 of the stator 402, as shown in FIG. 4. Specifically, the fins arranged in adjacent circles on rotor 400 may be radially separated from one another to allow corresponding fins of stator 402 to interpose therebetween. For example, the radial gap between fins 500 and 501 of rotor 400 may be sufficient to permit corresponding fin 512 of stator 402 to interpose therebetween. Likewise, the radial gap between fins 501 and 502 of the rotor 400 may be sufficient to permit corresponding fin 513 of stator 402 to interpose therebetween. On the stator side, the radial gap between fins 512 and 513, for example, may be sufficient to permit corresponding fin 501 of rotor 400 to interpose therebetween.

In some embodiments, the radial distance separating fins of adjacent concentric circles may be uniform across all fins 500-509 of rotor 400 and all fins 512-521 of stator 402. Thus, each of fins 500-509 and 512-521 may also have a uniform width. However, in some alternative embodiments, fin width and radial gap width may be varied across fins 500-509 and 512-521. For example, fin 513 of stator 402 may be wider than fin 512. Accordingly, to accommodate the larger fin 513, the gap between fins 501 and 502 of rotor 400 may be larger than the gap between fins 500 and 501 corresponding to fin 512. Thus, in general, the radial gap between two fins in adjacent circles may be proportional to a width of a corresponding fin configured to interpose therebetween. The radial gap may additionally provide a clearance between the interposing fins to reduce or eliminate friction during rotation of the rotor 400 with respect to stator 402. In one example, the radial gap may be 300 microns.

The interposition of fins 500-509 of rotor 400 with fins 512-521 of stator 402 may form a thermally conductive path that may provide for heat flow from heat source 406 to cooling device 408. In particular, heat may flow from heat source 406, through coupling 410, to rotor 400 and fins 500-509 thereof. Heat may then flow from fins 500-509 of rotor 400 to fins 512-521 of stator 402 by way of an air gap between the interposing fins. Further, heat may flow from fins 512-521 to the plate of stator 402 and through coupling 412 to be absorbed by cooling device 408. Thus, since rotor 400 may rotate with respect to stator 402 about joint 404, the thermal rotary link may be used to dissipate heat from a rotating heat source such as a LIDAR device that may need cooling to be maintained at a stable operating temperature.

In some embodiments, stator 402, as implied by the name, may be connected to a stationary, non-rotating device, surface, or object. Rotor 400 may rotate with respect to stationary stator 402. However, in alternative embodiments, rotor 400 and stator 402 may both rotate with respect to one another. For example, rotor 400 and stator 402 may rotate in opposite directions or may rotate in the same direction at different rates. Further, although rotor 400 is illustrated in FIG. 4 as being larger than stator 402, in some alternative embodiments stator 402 may be larger than rotor 400.

V. Alternative Fin Arrangements

Figure 6A:
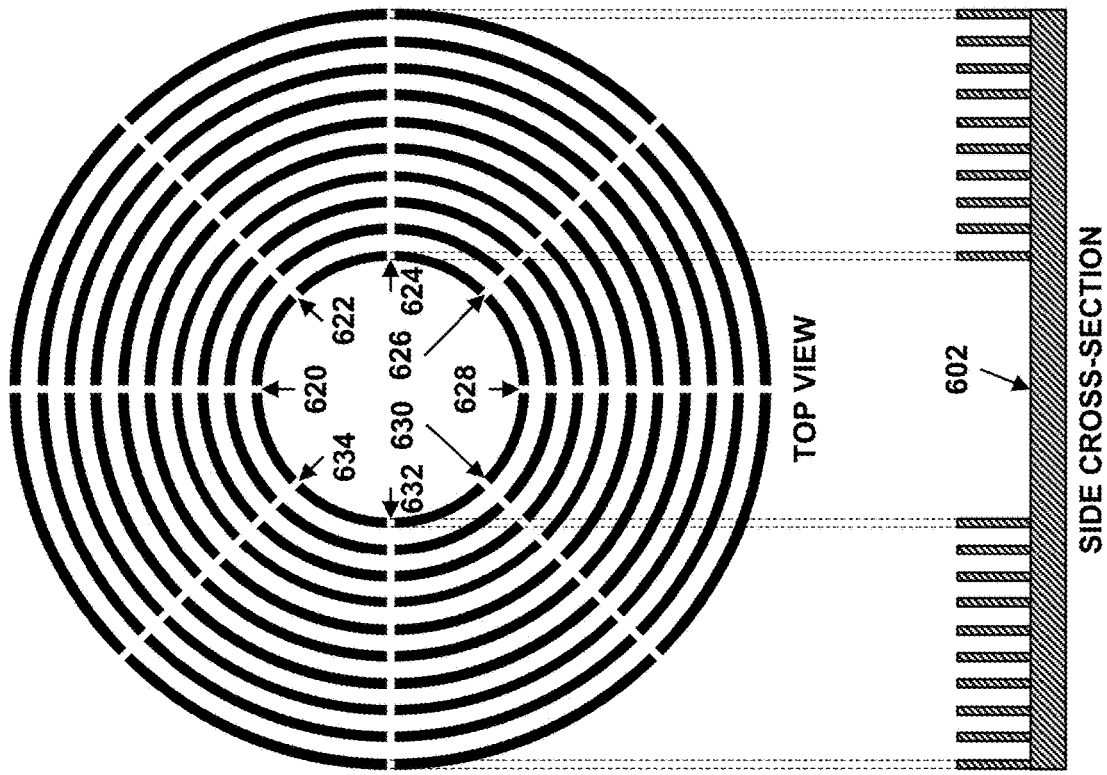
FIG. 6A illustrates another example rotor, according to an example embodiment.
Figure 6B:
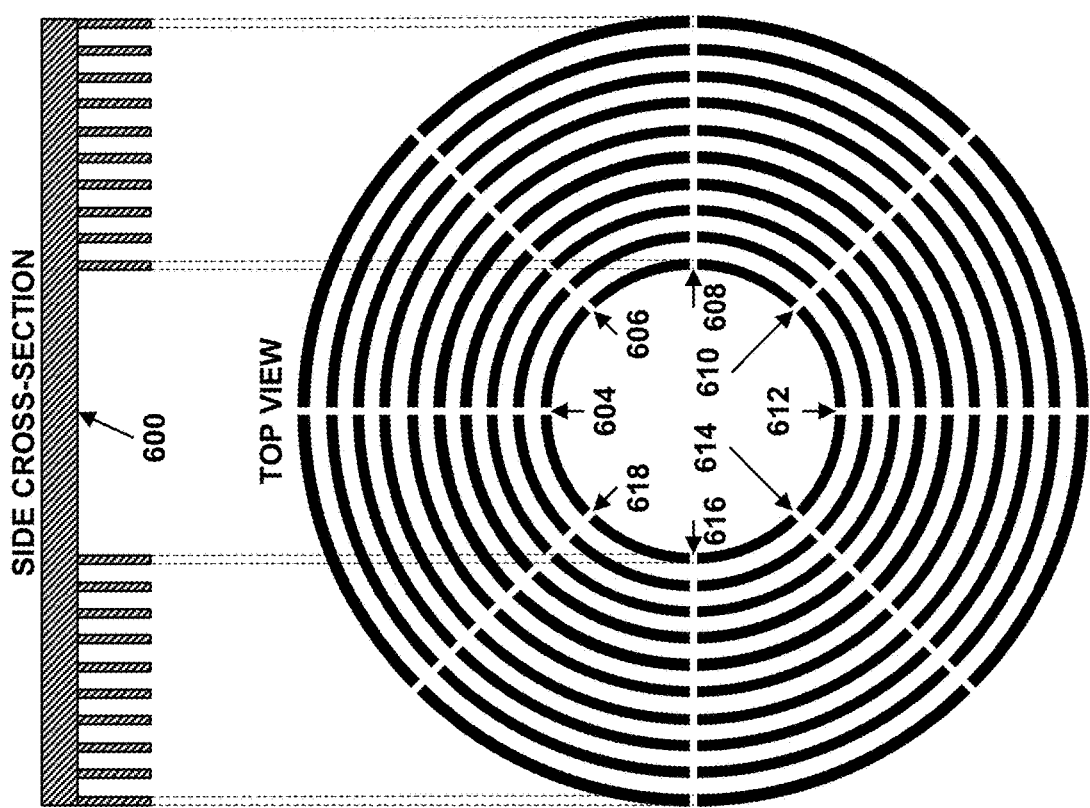
FIG. 6B illustrates another example stator, according to an example embodiment.

In some embodiments, two or more fins may be included within a single concentric circle, as illustrated in FIGS. 6A and 6B. Specifically, the fins within each concentric circle of rotor 600 may be separated by angular offsets defined by radial cuts 604, 606, 608, 610, 612, 614, 616, and 618. Thus, each concentric circle may include therein eight discontinuous fins. Likewise, fins within each concentric circle of stator 602 may be separated by angular offsets defined by radial cuts 620, 622, 624, 626, 628, 630, 632, and 634. Each fin may have the same curvature as the respective concentric circle about the circumference of which it is arranged. In some embodiments, cuts 604-634 may form patterns other than straight lines such as, for example, splines. Thus, the angular position of the angular offsets may vary between different concentric circles.

In some embodiments, the angular offsets may help generate convective fluid flow in response to rotation of rotor 600 and the plurality of fins thereon with respect to stator 602 and the plurality of fins thereon. Specifically, when the relative rotation speed between the rotor 600 and stator 602 exceeds a threshold speed, the fluid flow between the interposing fins may become turbulent, thus increasing the extent of convective heat transfer. Accordingly, heat may be removed from the heat source by conduction as well as convection and the relative contribution of each effect to the total heat transfer may vary with the relative speed of rotation between the rotor and the stator. Further, the pattern of cuts 604-634 (e.g., linear radial lines, splines, etc.) may be selected to increase or maximize turbulence to increase the extent of convective heat transfer.

VI. Example Thermal Rotary Link for LIDAR Device

Figure 7A:
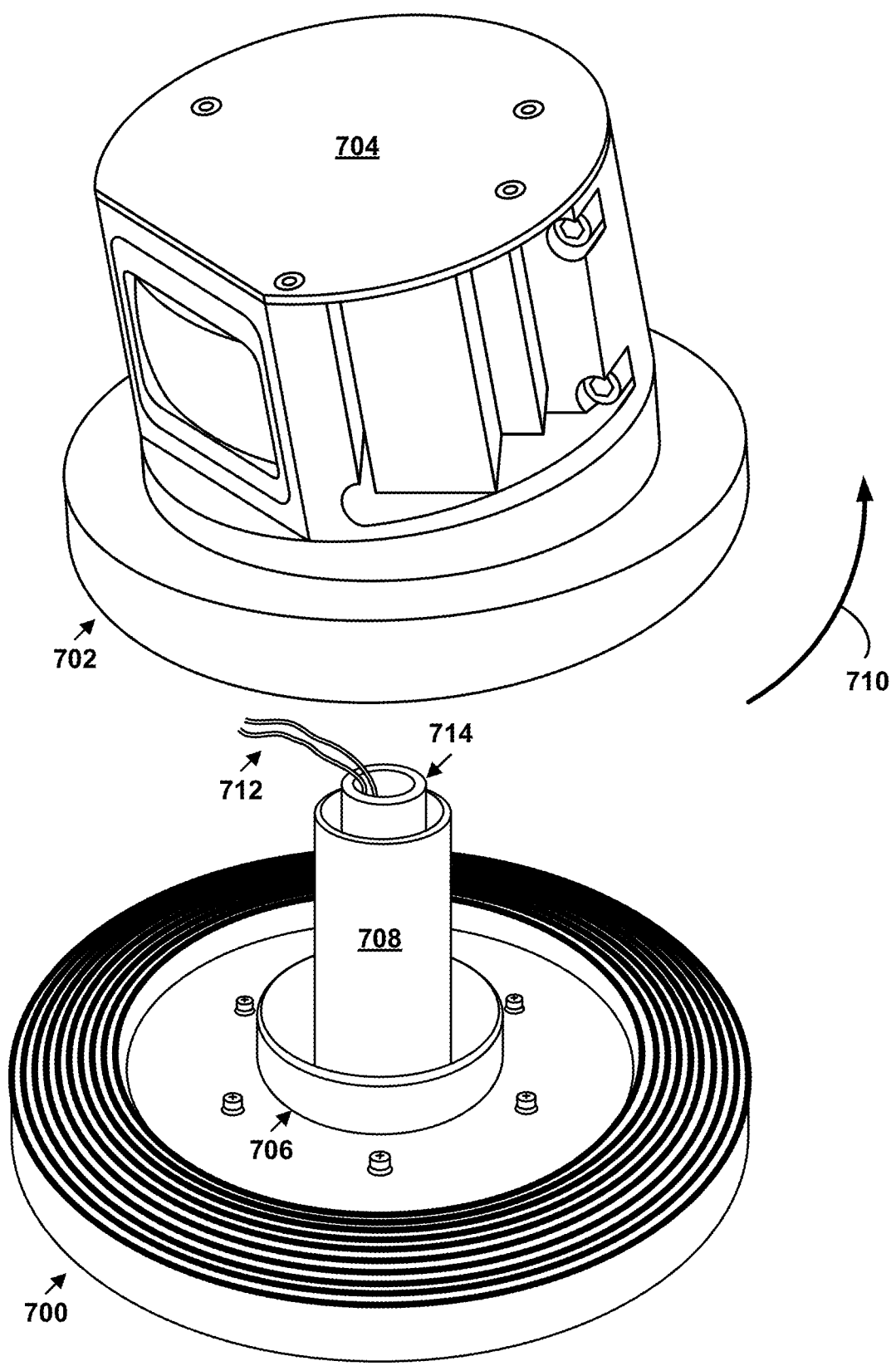
FIG. 7A illustrates a LIDAR device connected to a thermal rotary link, according to an example embodiment.

FIG. 7A illustrates an example thermal rotary link for transferring heat away from a rotating LIDAR device. Rotor 702 is shown connected to the bottom of the housing of LIDAR device 704. LIDAR device 704 may be the same as or similar to LIDAR device 100 of FIG. 1. Heat-producing components within the housing of LIDAR device 704 may be in thermal contact with the top of the plate of rotor 702. Rotor 702 includes on the underside thereof a plurality of fins (not shown) configured to interpose with the plurality of fins of stator 700. Rotor 702 may connect to stator 700 by way of a rotational joint system that includes rods/shafts 708 and 714. Stator 700 may be mounted to a cooling device (not shown) to absorb the heat transferred from LIDAR 704 by way of the thermal rotary link.

The LIDAR, thermal rotary link, and cooling device may be mounted to a vehicle configured for autonomous operation based on data from the LIDAR device. For example, the LIDAR may be mounted on the roof of the vehicle, hood of the vehicle, doors of the vehicle, or trunk of the vehicle. In some embodiments, multiple LIDAR devices may be included on the vehicle, each providing information about a particular region around the vehicle. Further, in some examples, portions of the LIDAR device, the thermal rotary link, and/or the cooling device may be located inside the vehicle frame.

The rotational joint system may include rods/shafts 708 and 714. Stator 700 may include a circular hole 706 concentric with the axis of rotation of the stator 700. A first end of hollow rod 708 may be connectable to stator 700 by way of one or more screws or bolts. In some embodiments, stator 700 and rod 708 may be manufactured as one piece. Rod 708 may protrude through the circular hole 706, in the same direction as the fins, such that a second end of rod 708 is connectable to rotor 702, as illustrated in FIG. 7A. Rod 714 may have a smaller diameter than rod 708 and may thus fit within rod 708. A first end of rod 714 may be rigidly connectable to rotor 702 and/or LIDAR 704.

One or more bearings may be used to rotatably mount rod 714 inside of rod 708. A motor may be connected to rod 714 to rotate rod 714 with respect to rod 708, thus rotating rotor 702 and LIDAR 704 with respect to stator 700. In some embodiments, the motor may be configured to rotate rotor 702 and stator 704 at a rate dictated by the data acquisition rate of the LIDAR device. A plurality of wires including power and data connections may pass through rods 708 and 714 to connect the LIDAR device to a power source and a computing device (e.g., a computing device configured to autonomously operate a vehicle based on data from the LIDAR device). One or more slip rings may be included within the rotational joint system to transfer power and data through the rotational connection. In some embodiments, power transfer may rely on the slip rings while data may be transferred to the computing device wirelessly.

Figure 7B:
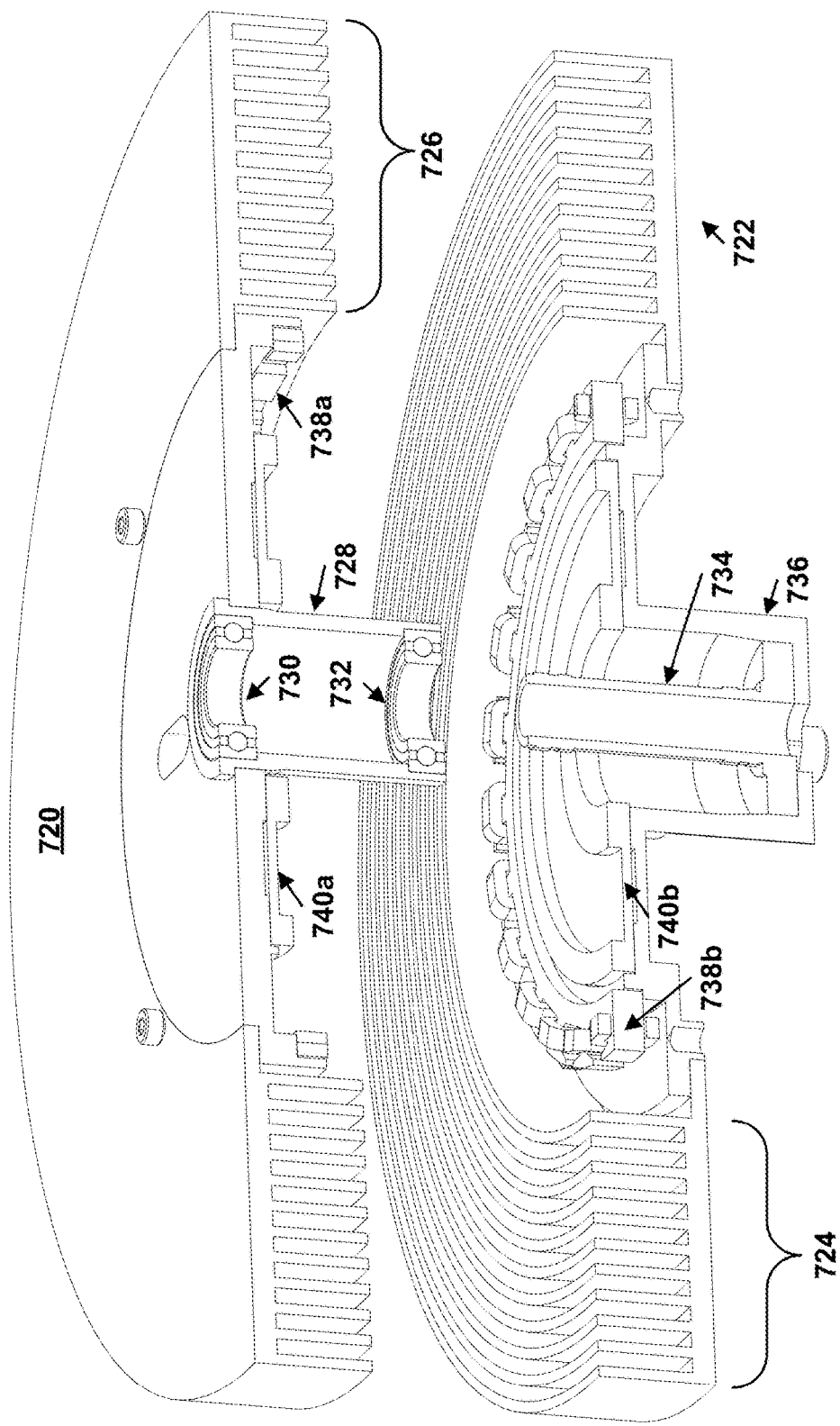
FIG. 7B illustrates a cross-section of an exploded view of a thermal rotary link, according to an example embodiment.

FIG. 7B illustrates a cross-section of an exploded view of another example thermal rotary link. The thermal rotary link may include a stator comprising a first plate 722 and a first plurality of fins 724 protruding perpendicularly from a first side of plate 722. Further, the thermal rotary link may include a rotor comprising a second plate 720 and a second plurality of fins 726 protruding perpendicularly from a first side of plate 724. The first and second pluralities of fins 724 and 726 may be arranged in concentric circles spaced to allow the first plurality of fins 724 to interpose with the second plurality of fins 726, as previously described.

A first hollow shaft 736 may be connected to plate 722 of the stator. Hollow shaft 736 may include therein a guide rod 736. A second hollow shaft 728 may be connected to plate 720 of the rotor. Shaft 728 may include therein bearings 730 and 732 to provide for rotation of hollow shaft 728 about guide rod 734. The inner bore diameter of shaft 736 may correspond to an outer diameter of shaft 728 to accommodate shaft 728 inside shaft 736. Shaft 736 may extend away from the finned side of plate 722 through to the non-finned side. Thus, when shaft 728 is disposed about guide rod 734 within shaft 736, the first plurality of fins 724 may be vertically positioned to interpose with the plurality of fins 726.

FIG. 7B further illustrates rotary transformer windings 740a and 740b disposed within a cavity defined by plates 720 and 722 and the innermost fins of the pluralities of fins 724 and 726. Specifically, the transformer includes a secondary winding 740a that rotates with respect to a stationary primary winding 740b to transfer power across the rotational connection between the stator to the rotor without using slip rings. Additionally, a motor configured to drive the rotor (and the heat source connected thereto) with respect to the stator may be disposed within the cavity. In particular, the motor may include motor windings 738b connected to the stator and permanent magnets 738a connected to the rotor. The windings 738b are connected to the stator, as opposed to the rotor, so that energy to power the motor is not transferred through the rotational connection via rotary transformer 740a/740b (thus allowing for a smaller rotary transformer).

VII. Example Thermal Rotary Link Operations

Figure 8:
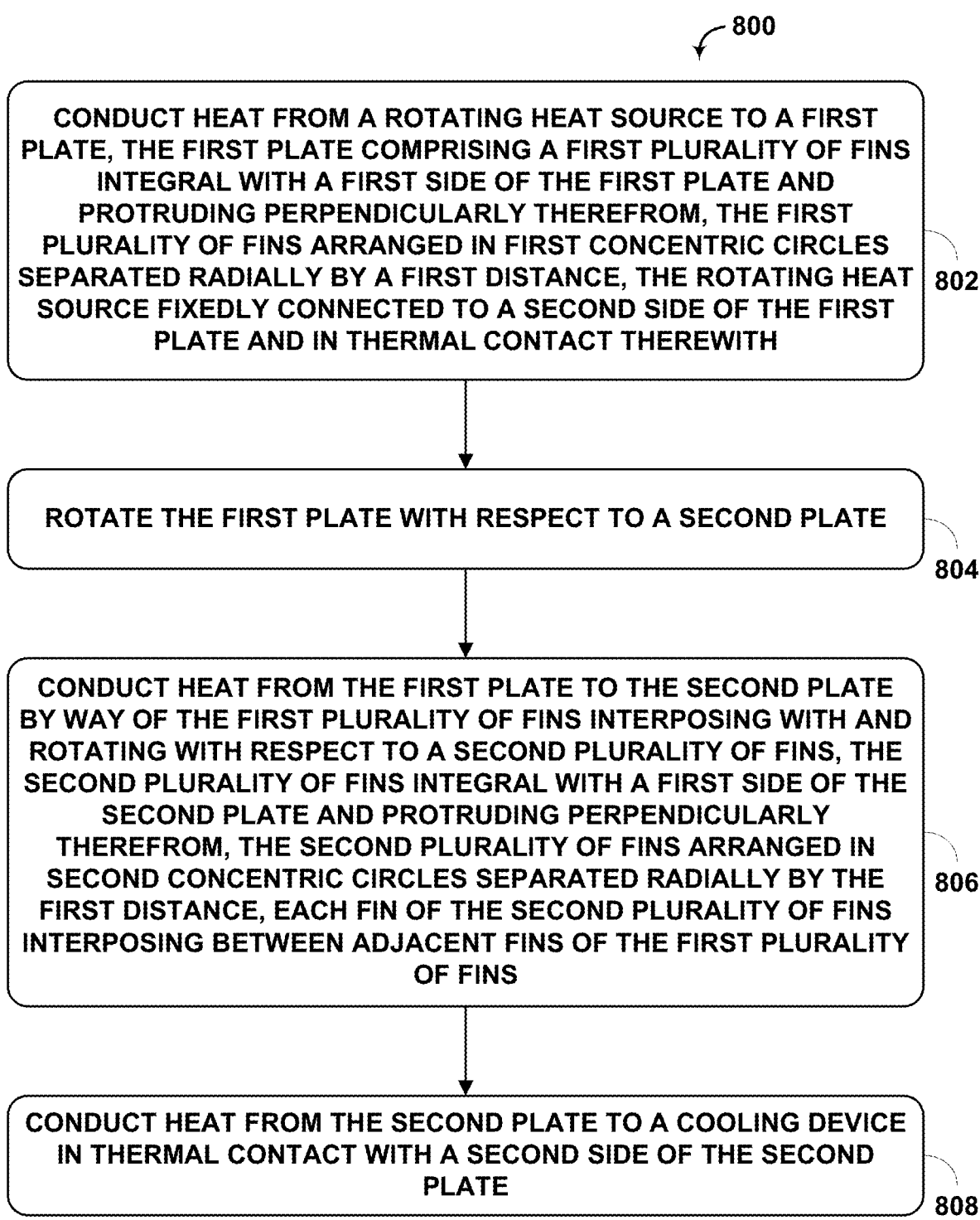
FIG. 8 illustrates example operations of a thermal rotary link, according to an example embodiment.

FIG. 8 illustrates flow diagram 800 of example operations that may be performed by an example thermal rotary links discussed herein. The operations may be performed to transfer heat between two devices, systems, or objects that are in rotational motion with respect to each other. Heat may be transferred by a combination of conduction and convection through a fluid-filled gap between interposing fins of the thermal rotary link, thus allowing the relative rotational motion between the heat source and the cooling device. In some implementations, heat may be transferred primarily through conduction.

In block 802, heat may be conducted from a rotating heat source to a first plate. The first plate may include a first plurality of fins integral with a first side of the first plate and protruding perpendicularly therefrom. The first plurality of fins may be arranged in first concentric circles separated radially by a first distance. The rotating heat source may be fixedly connected to a second side of the first plate and may be in thermal contact therewith. The first plate and the first plurality of fins may collectively make up the rotor portion of the thermal rotary link.

In block 804, the first plate may be rotated with respect to a second plate. The rotation may be caused by, for example, a motor and may be about a rotational joint connecting the first plate to the second plate. In some embodiments, the first and second plates may each be planar circular plates configured to rotate about an axis through the center of each plate. In some examples, the rate of rotation of the first plate with respect to the second plate may determine the extent of convective heat transfer. In particular, rotation of the first plate with respect to the second plate at a rate of speed greater than a threshold speed may create turbulent, as opposed to laminar, fluid flow within the thermal rotary link, thus improving convective heat transfer.

In block 806, heat may be conducted from the first plate to the second plate by way of the first plurality of fins interposing with and rotating with respect to a second plurality of fins. The second plurality of fins may be integral with a first side of the second plate and protruding perpendicularly therefrom. The second plurality of fins may be arranged in second concentric circles separated radially by the first distance. Each fin of the second plurality of fins may interpose between adjacent fins of the first plurality of fins. The second plate and the second plurality of fins may collectively make up the stator portion of the thermal rotary link.

In block 808, heat may be conducted from the second plate to a cooling device in thermal contact with a second side of the second plate. The cooling device may be any device or object at a temperature lower than the heat source and capable of absorbing and/or dissipating the heat transferred from the heat source. The cooling device may be, for example, a cold plate or a radiator.

VIII. Example Thermal Rotary Link Performance Characteristics

Figure 9A:
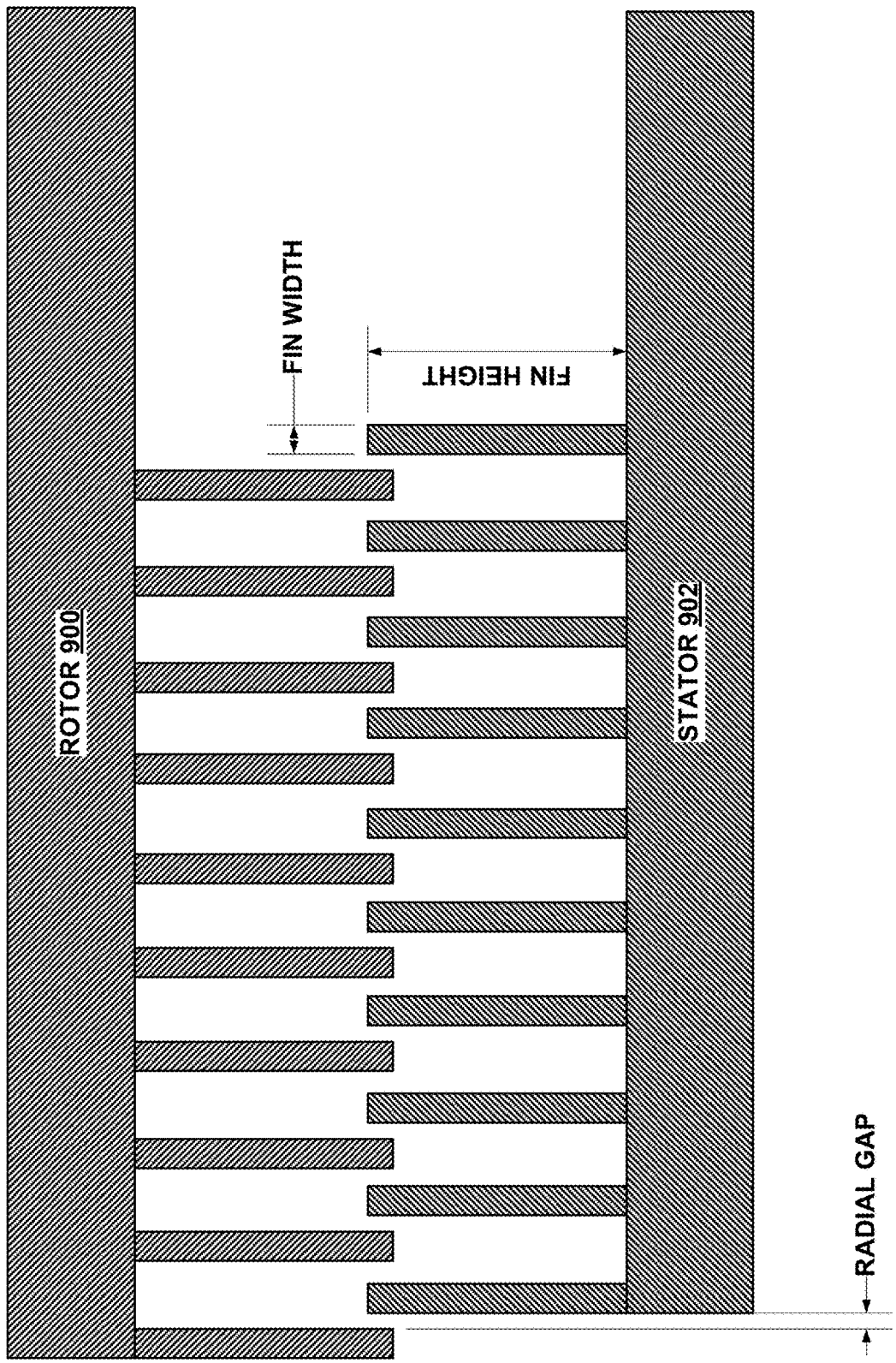
FIG. 9A illustrates a close-up view of a rotor and stator, according to an example embodiment.

FIG. 9A illustrates example parameters of the thermal rotary link that may be varied to control the rate of heat transfer between rotor 900 and stator 902. In particular, heat transfer between rotor 900 and stator 902 may be affected by fin width, fin height, and the radial gap between adjacent fins. Further, heat transfer may be affected by the number of fins on the rotor and on the stator. These parameters may collectively affect the extent of surface area on the fins of the rotor and the stator through which heat can be transferred. FIGS. 9B, 9C, 9D, 9E, and 9F detail the effects of the individual parameters on the heat transfer capacity of the thermal rotary link.

Figure 9B:
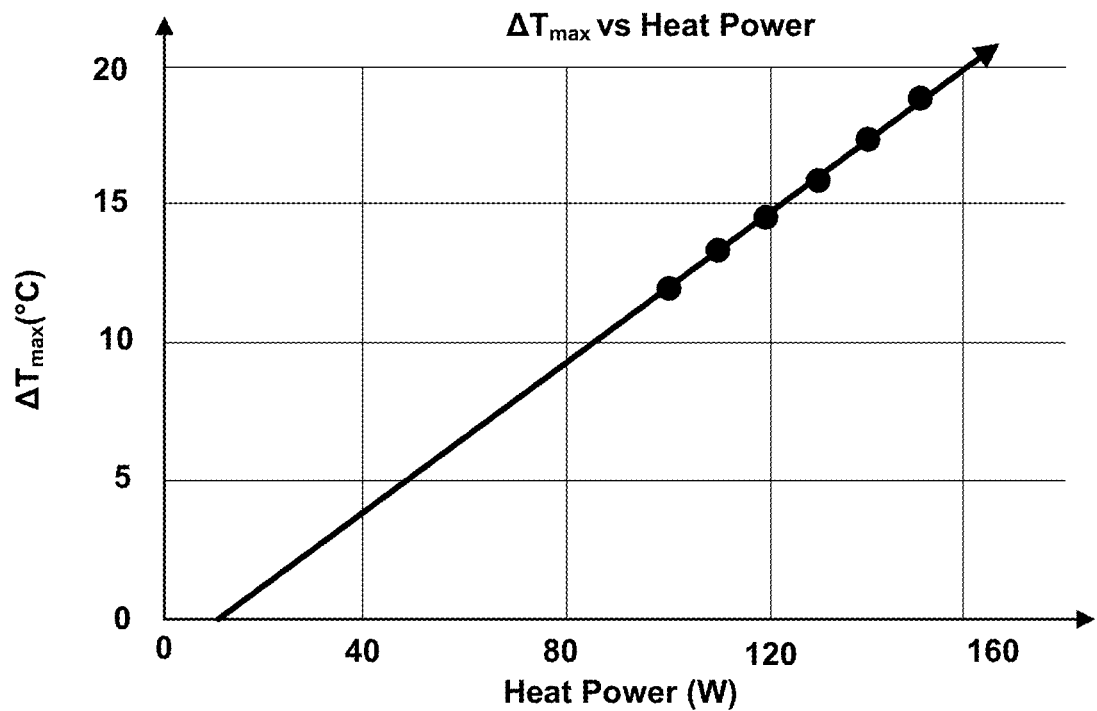
FIG. 9B illustrates a temperature difference as a function of heat power, according to an example embodiment.

FIG. 9B illustrates the capacity of an example thermal rotary link to transfer heat between the heat source and the cooling device across different heat loads. In particular, FIG. 9B graphs a real-world temperature difference measured between the plates of the rotor and the stator across different heat loads for an example thermal rotary link that includes 10 fins on each of the rotor and the stator, a fin width of 1 millimeter, a fin height of 10 millimeters, and a gap of 300 microns between the interposed fins across all fins. FIG. 9B illustrates that the temperature difference between the rotor and the stator increases linearly in proportion to the heat applied by the heat source. In particular, for each additional Watt of power, the temperature difference increases by 0.133° C. (with a y-intercept of −1.36° C.). Thus, for example, in order to maintain the rotor plate connected to a heat source expected to produce 120 Watts of heat power at an operating temperature below 50° C., a cooling device capable of maintaining a temperature below 35° C. could be used in the system.

Figure 9C:
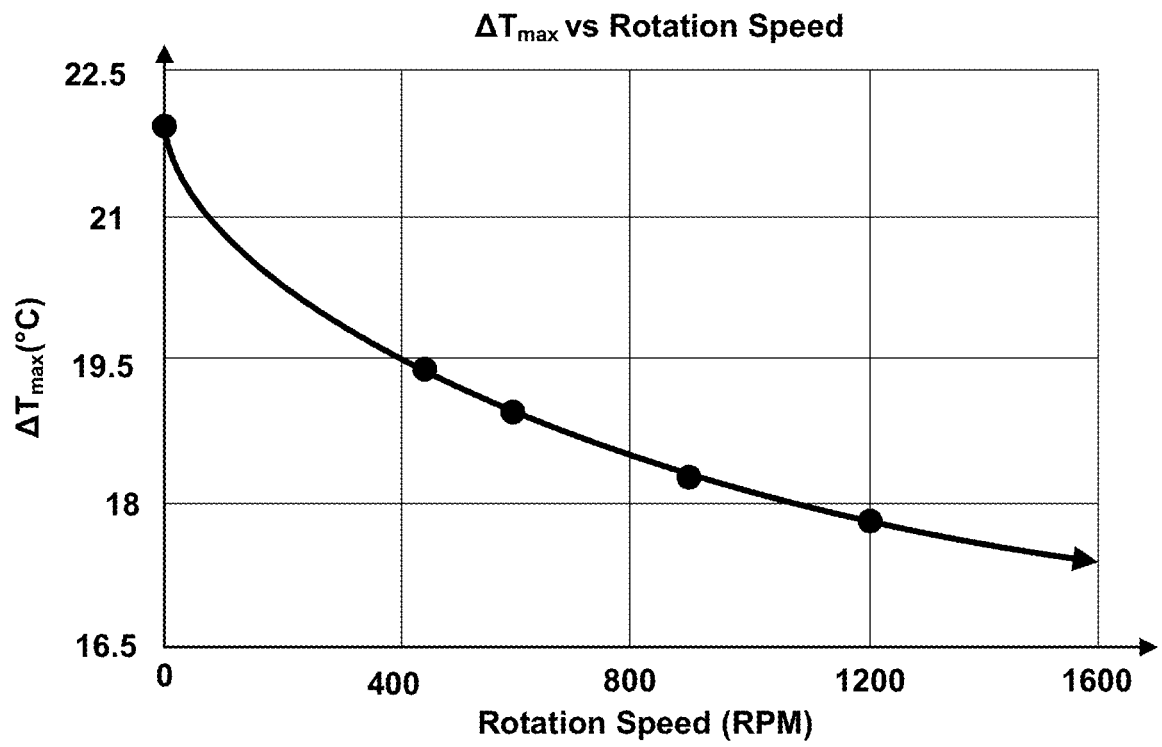
FIG. 9C illustrates a temperature difference as a function of rotation speed, according to an example embodiment.

FIG. 9C illustrates the capacity of the thermal rotary link described with respect to FIG. 9B to transfer heat between the heat source and the cooling device across different rotational speeds. FIG. 9C represents real world experimental data. In particular, a decrease in the temperature difference between the rotor and stator may be gained by increasing the rotation speed of the rotor with respect to the stator. However, the scaling is nonlinear and exhibits diminishing returns for large increases in rotational speed above zero rotations per minute (RPM). In other words, the marginal benefit of each additional RPM decreases in proportion to the current RPM of the rotor. Thus, in implementations where rotor RPM is a manipulable variable, an optimum RPM may be selected that weighs the added cooling benefit of increased rotation speed against the increased power expenditure to maintain the rotation speed based on the particular application of the thermal rotary link. In the example embodiment of the rotating LIDAR device described above, the rotor RPM may be fixed to the rotational speed dictated by the rotating LIDAR device.

Figure 9D:
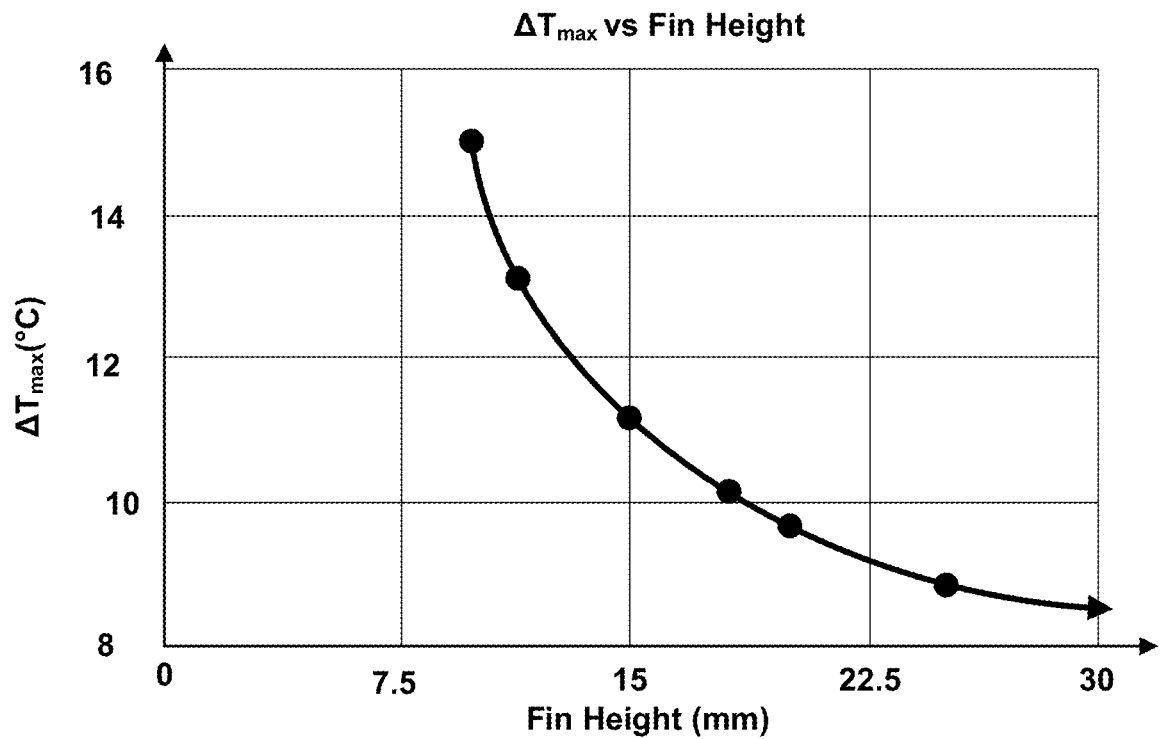
FIG. 9D illustrates a temperature difference as a function of fin height, according to an example embodiment.

FIG. 9D illustrates the capacity of an example thermal rotary link to transfer heat between the heat source and the cooling device across different fin heights. In particular, FIG. 9D graphs a simulated temperature difference between the plates of the rotor and the stator across different fin heights for an example thermal rotary link that includes 15 fins on each of the rotor and the stator, a fin width of 1 millimeter, and a gap of 300 microns between the interposed fins under a heat load of 150 Watts. The temperature difference decreases nonlinearly as fin height is increased. In particular, the marginal benefit of an increase in fin height decreases in proportion to fin height.

Figure 9E:
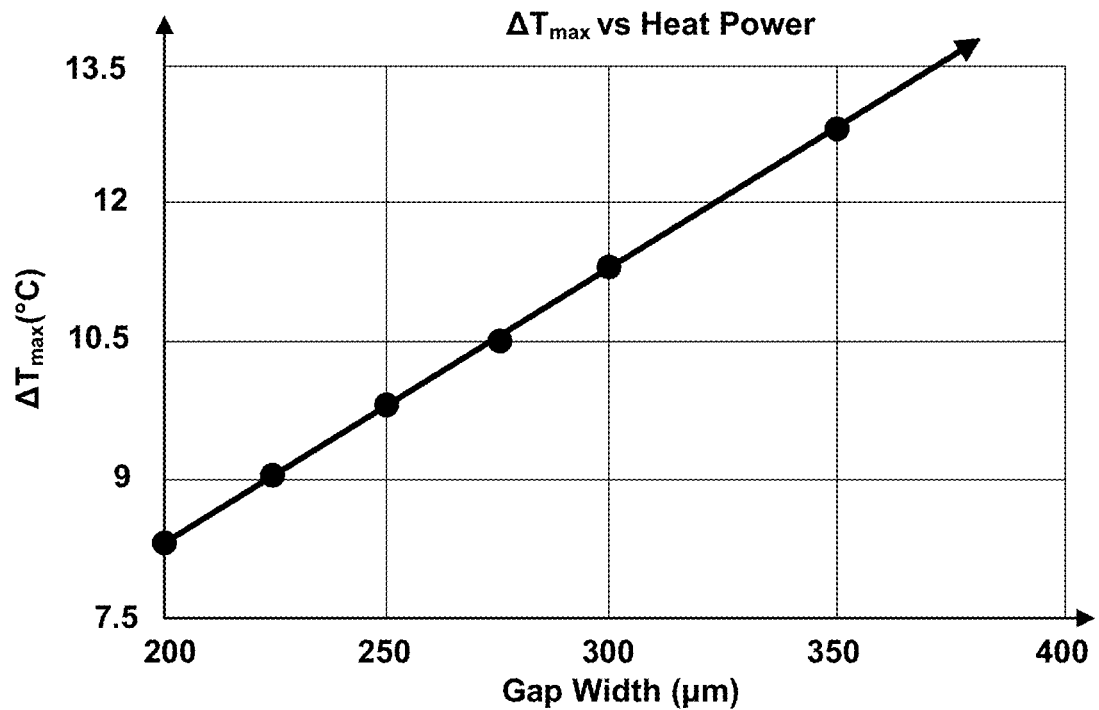
FIG. 9E illustrates a temperature difference as a function of gap width between interposing fins, according to an example embodiment.

FIG. 9E illustrates the capacity of an example thermal rotary link to transfer heat between the heat source and the cooling device across different gap widths between the interposing fins. In particular, FIG. 9E graphs a simulated temperature difference between the plates of the rotor and the stator across different gap widths for an example thermal rotary link that includes 15 fins on each of the rotor and the stator, a fin width of 1 millimeter, and a fin height of 15 millimeters under a heat load of 150 Watts. The temperature difference increases linearly as the gap width is increased. In particular, an increase of 1 micron in gap width contributes an increase of 0.03° C. in temperature difference.

Figure 9F:
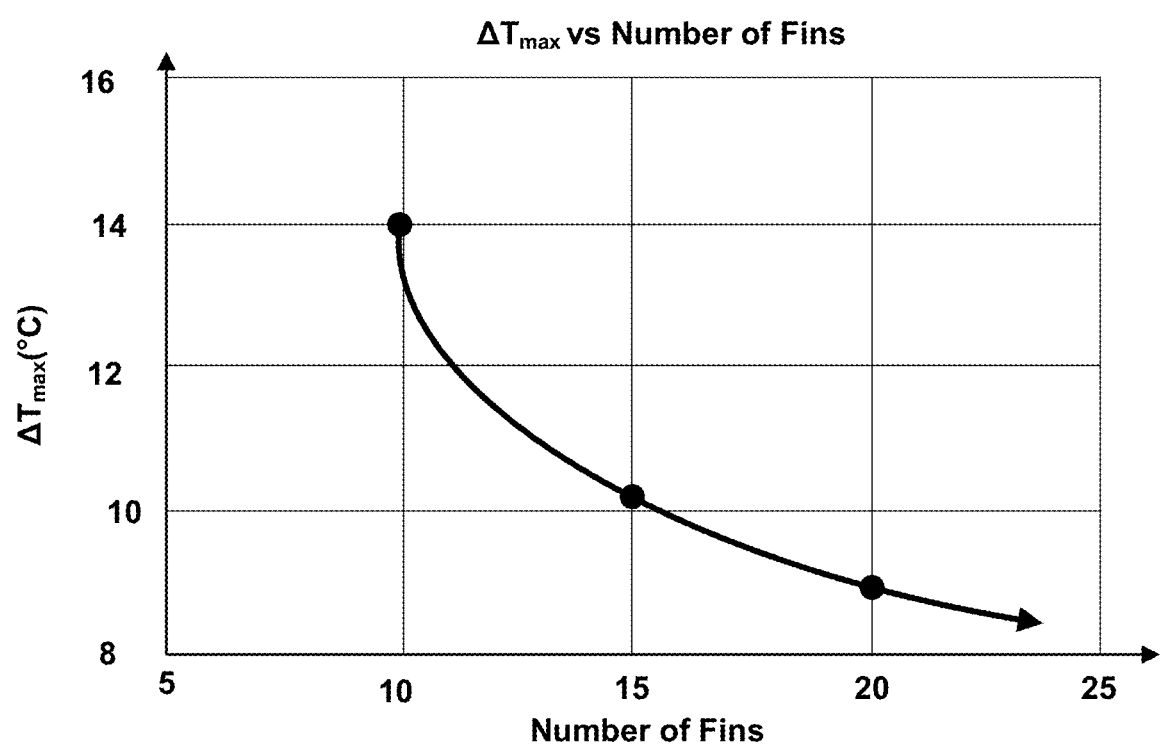
FIG. 9F illustrates a temperature difference as a function of a number of fins, according to an example embodiment.

FIG. 9F illustrates the capacity of an example thermal rotary link to transfer heat between the heat source and the cooling device across different numbers of fins. In particular, FIG. 9D graphs a simulated temperature difference between the plates of the rotor and the stator across different numbers of fins for an example thermal rotary link that includes a fin width of 1 millimeter, a fin height of 15 millimeters, and a gap width of 300 microns between the interposed fins under a heat load of 150 Watts. The temperature difference decreases nonlinearly as the number of fins is increased. In particular, the marginal benefit of each additional fin decreases in proportion to the number of fins.

Parameters of the thermal rotary link such as gap width, number of fins, fin height, and fin width may be determined in combination with considerations of manufacturing tolerances, cost, size limitations, and robustness of the thermal rotary link to damage and deformations during normal use. The relationships illustrated in FIGS. 9A-9F may be used to adapt the example thermal rotary links herein described to other applications.

Figures 10A, 10B:
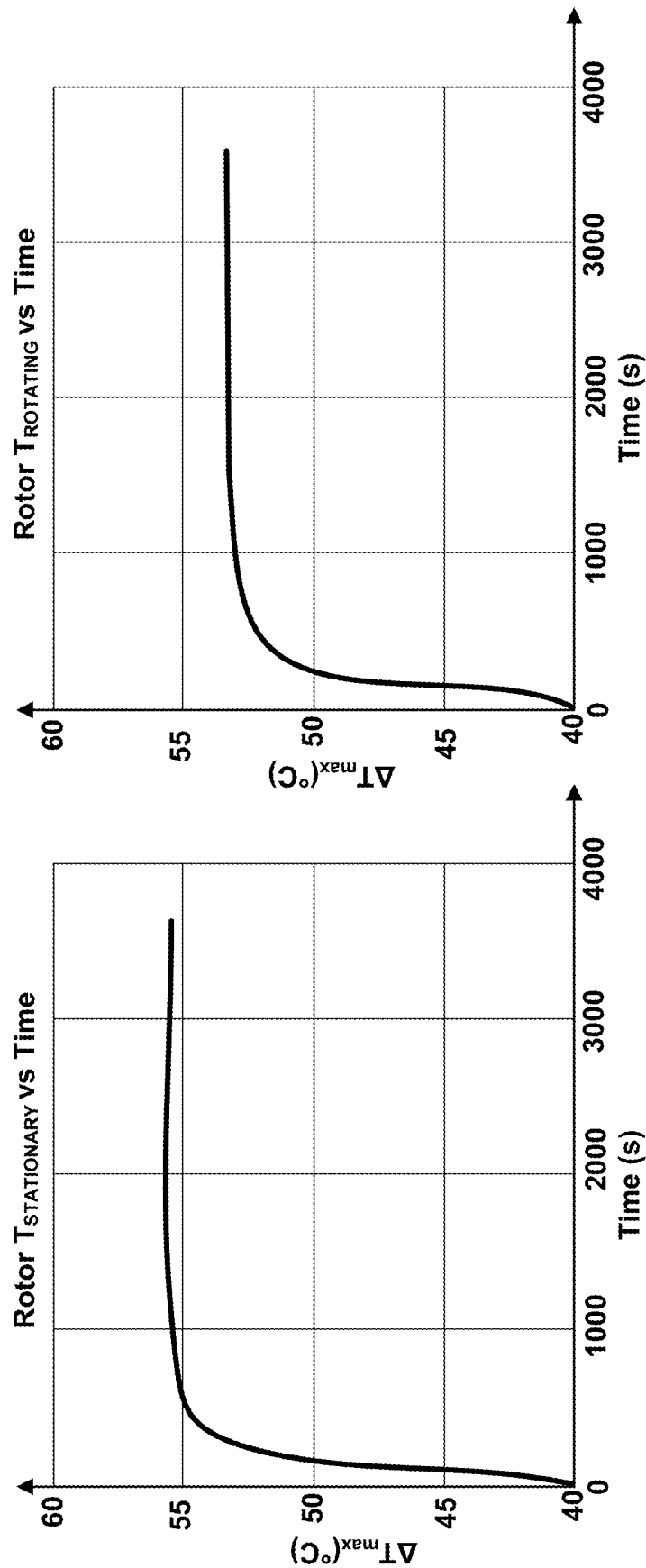
FIG. 10A illustrates a steady-state temperature of a stationary rotor, according to an example embodiment.
FIG. 10B illustrates a steady-state temperature of a rotating rotor, according to an example embodiment.

FIGS. 10A and 10B illustrate the effects of rotation of the rotor with respect to the stator on the steady-state temperature at the rotor plate. In particular, FIGS. 10A and 10B graph a real-world rotor plate temperature measured over time for a thermal rotary link including 17 fins with a height of 13 millimeters, a width of 1 millimeter, and a gap width between interposed fins of 300 microns under a heat load of 150 Watts. FIG. 10A shows that a stationary rotor settles to a steady-state temperature of approximately 55.6° C. FIG. 10B illustrates that spinning the rotor with respect to the stator contributes an additional decrease of 2.1° C. in the steady-state temperature of the rotor. Thus, the rotor reaches a steady state temperature of 53.5° C. when rotating with respect to the stator.

IX. Additional Example Thermal Rotary Link Embodiments

Figure 11:
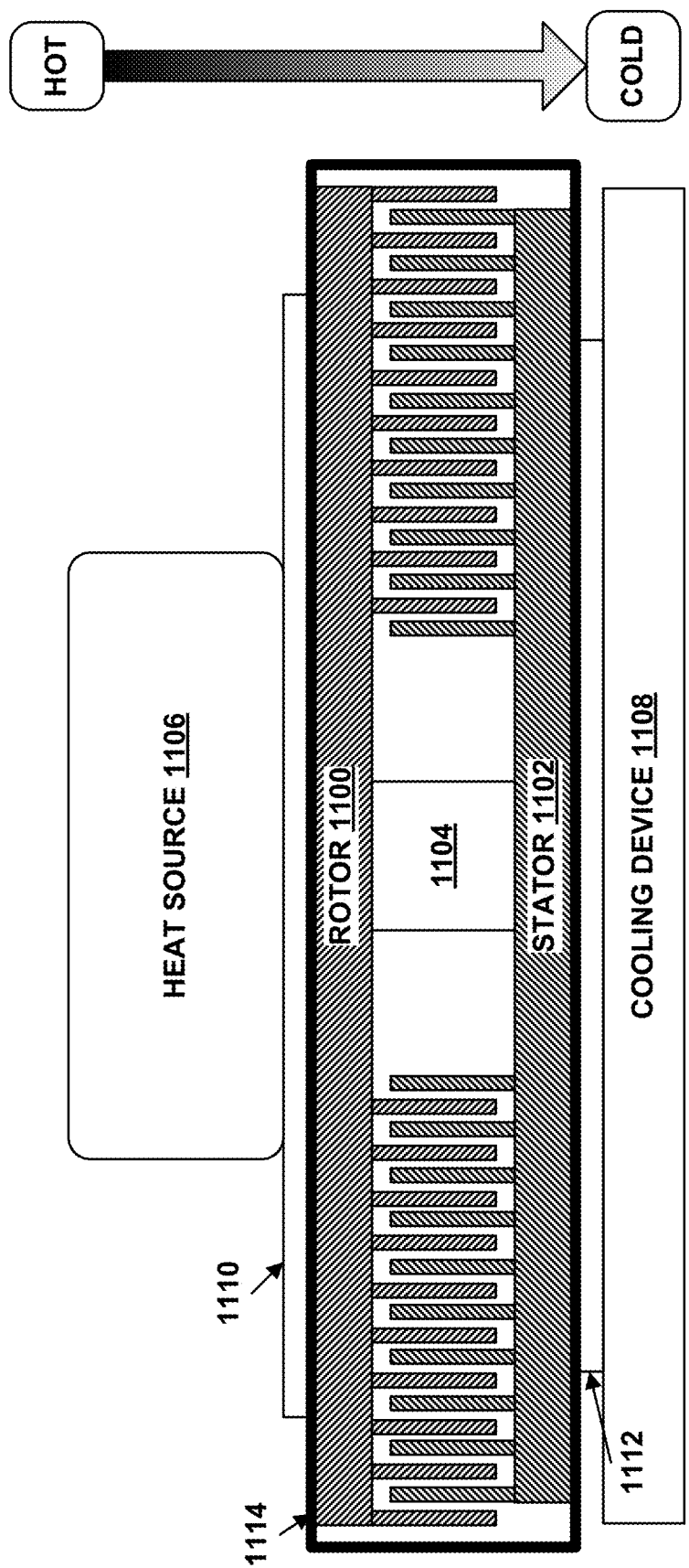
FIG. 11 illustrates a sealed chamber enclosing a thermal rotary link, according to an example embodiment.

FIG. 11 illustrates an example thermal rotary link disposed within a sealed chamber. In particular, similarly to FIG. 4, FIG. 11 illustrates a heat source 1106 connected to a cooling device 1108 through a thermal rotary link that includes rotor 1100, stator 1102, and rotational joint 1104 connecting rotor 1100 to stator 1102. Further, coupling 1110 may mechanically and thermally connect heat source 1106 to rotor 1100. Similarly, coupling 1112 may mechanically and thermally connect cooling device 1108 to stator 1102.

The sealed chamber 1114 enclosing the rotor 1100 and stator 1106 may be filled with a thermally conductive fluid other than atmospheric air to maintain thermal contact between the fins of the rotor and the fins of the stator. In particular, the sealed chamber may be filled with a gas that is more thermally conductive than oxygen such as, for example, helium (Helium thermal conductivity 0.138 W/mK, atmospheric air thermal conductivity 0.024 W/mK). Alternatively, the sealed chamber may be filled with a liquid that is more conductive than atmospheric air such as, for example, a mixture of water and ethylene glycol. The increased conductivity may be weighed against the increase in drag caused by the fluid during rotation of the rotor 1100 with respect to stator 1102 in selecting a fluid with which to fill the sealed chamber.

X. Conclusion

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims.

The above detailed description describes various features and functions of the disclosed systems, devices, apparatuses, and methods with reference to the accompanying figures. In the figures, similar symbols typically identify similar components, unless context dictates otherwise. The example embodiments described herein and in the figures are not meant to be limiting. Other embodiments can be utilized, and other changes can be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

A block that represents a processing of information may correspond to circuitry that can be configured to perform the specific logical functions of a herein-described method or technique. Alternatively or additionally, a block that represents a processing of information may correspond to a module, a segment, or a portion of program code (including related data). The program code may include one or more instructions executable by a processor for implementing specific logical functions or actions in the method or technique. The program code and/or related data may be stored on any type of computer readable medium such as a storage device including a disk or hard drive or other storage medium.

The particular arrangements shown in the figures should not be viewed as limiting. It should be understood that other embodiments can include more or less of each element shown in a given figure. Further, some of the illustrated elements can be combined or omitted. Yet further, an example embodiment can include elements that are not illustrated in the figures.

While various aspects and embodiments have been disclosed herein, other aspects and embodiments will be apparent to those skilled in the art. The various aspects and embodiments disclosed herein are for purposes of illustration and are not intended to be limiting, with the true scope being indicated by the following claims.

What is claimed is:

1. An apparatus comprising:
a first plate having a first side;
a first plurality of fins integral with the first side of the first plate and protruding perpendicularly therefrom, the first plurality of fins arranged in first concentric circles separated radially by a first distance, wherein a first plurality of radial cuts extend through the first concentric circles, wherein the first plurality of radial cuts divide each concentric circle of the first concentric circles into two or more fins of the first plurality of fins;
a second plate having a first side and a second side opposite the first side, wherein the second plate is rotatably coupled to the first plate, and wherein the second side is fixedly connected to a heat source to maintain thermal contact between the second plate and the heat source, wherein the heat source comprises a light detection and ranging (LIDAR) device, and wherein the second plate is configured to rotate with respect to the first plate to cause rotation of the LIDAR device; and
a second plurality of fins integral with the first side of the second plate and protruding perpendicularly therefrom, the second plurality of fins arranged in second concentric circles separated radially by the first distance, wherein each fin of the second plurality of fins interposes between adjacent fins of the first plurality of fins to transfer heat between the second plate and the first plate, wherein a second plurality of radial cuts extend through the second concentric circles, wherein the second plurality of radial cuts divide each concentric circle of the second concentric circles into two or more fins of the second plurality of fins.

2. The apparatus of claim 1, wherein each fin of the first plurality of fins and the second plurality of fins has a first thickness, and wherein each of the second concentric circles is radially offset from each of the first concentric circles by at least the first thickness to allow each fin of the second plurality of fins to interpose between adjacent fins of the first plurality of fins.

3. The apparatus of claim 1, further comprising:
a chamber defined between the first side of the first plate, the first side of the second plate, and innermost fins of the first plurality of fins and the second plurality of fins.

4. The apparatus of claim 3, further comprising:
a transformer disposed within the chamber, wherein the transformer is configured to provide wireless power to the LIDAR device and comprises (i) a primary winding connected to the first plate and (ii) a secondary winding connected to the second plate.

5. The apparatus of claim 3, further comprising:
a motor disposed within the chamber and configured to rotate the second plate with respect to the first plate, the motor comprising:
one or more motor windings connected to the first plate; and
one or more magnets connected to the second plate.

6. The apparatus of claim 1, wherein the first plate comprises a second side opposite the first side, wherein the second side of the first plate is fixedly connectable to a cooling device to maintain thermal contact between the first plate and the cooling device.

7. The apparatus of claim 1, wherein the first plate comprises a circular hole concentric with the first plate, further comprising:
a rod rigidly connected at a first end thereof to the first plate, the rod protruding through the circular hole, wherein the second plate is rotatably connected to the first plate by way of a rotatable connection of the second plate to a second end of the rod.

8. The apparatus of claim 1, further comprising:
a sealed chamber enclosing the first plate and the second plate, wherein the first plate and the second plate are disposed within the sealed chamber with the first plurality of fins interposed with the second plurality of fins.

9. The apparatus of claim 8, wherein the sealed chamber is filled with a thermally conductive fluid to maintain thermal contact between the first plurality of fins and the second plurality of fins.

10. The apparatus of claim 1, wherein the first plate, the second plate, the first plurality of fins, and the second plurality of fins comprise a metallic material.

11. The apparatus of claim 1, wherein the LIDAR device comprises a fiber laser.

12. The apparatus of claim 11, wherein the fiber laser includes an optical amplifier.

13. A system, comprising:
a thermal rotary link comprising:
a first plate having a first side and a second side opposite the first side;
a first plurality of fins integral with the first side of the first plate and protruding perpendicularly therefrom, the first plurality of fins arranged in first concentric circles separated radially by a first distance, wherein a first plurality of radial cuts extend through the first concentric circles, wherein the first plurality of radial cuts divide each concentric circle of the first concentric circles into two or more fins of the first plurality of fins;
a second plate having a first side and a second side opposite to the first side, wherein the second plate is rotatably coupled to the first plate; and
a second plurality of fins integral with the first side of the second plate and protruding perpendicularly therefrom, the second plurality of fins arranged in second concentric circles separated radially by the first distance, wherein each fin of the second plurality of fins interposes between adjacent fins of the first plurality of fins to transfer heat between the second plate and the first plate, wherein a second plurality of radial cuts extend through the second concentric circles, wherein the second plurality of radial cuts divide each concentric circle of the second concentric circles into two or more fins of the second plurality of fins;
a rotating heat source thermally connected to the second side of the second plate, wherein the rotating heat source comprises an electronic device; and
a cooling device thermally connected to the second side of the first plate, the cooling device configured to absorb heat transferred from the rotating heat source by way of the thermal rotary link.

14. The system of claim 13, further comprising:
a chamber defined between the first side of the first plate, the first side of the second plate, and innermost fins of the first plurality of fins and the second plurality of fins.

15. The system of claim 14, further comprising:
a transformer disposed within the chamber, wherein the transformer is configured to provide wireless power to the electronic device and comprises (i) a primary winding connected to the first plate and (ii) a secondary winding connected to the second plate.

16. The system of claim 14, further comprising:
a motor disposed within the chamber and configured to rotate the second plate with respect to the first plate, the motor comprising:
one or more motor windings connected to the first plate; and
one or more magnets connected to the second plate.

17. The system of claim 13, wherein the electronic device comprises a light detection and ranging (LIDAR) device fixedly connected to the second side of the second plate, and wherein the second plate is configured to rotate with respect to the first plate to cause rotation of the LIDAR device.

18. The system of claim 17, further comprising:
a vehicle configured for autonomous operation based on data from the LIDAR device, wherein the cooling device, the thermal rotary link, and the LIDAR device are mounted to the vehicle.

19. The system of claim 13, wherein each fin of the first plurality of fins and the second plurality of fins has a first thickness, and wherein each of the second concentric circles is radially offset from each of the first concentric circles by at least the first thickness to allow each fin of the second plurality of fins to interpose between adjacent fins of the first plurality of fins.

20. The system of claim 17, wherein the LIDAR device comprises a fiber laser.

* * * * *